(12) United States Patent
Marriner

(10) Patent No.: US 10,657,061 B1
(45) Date of Patent: May 19, 2020

(54) RESOURCE DISTRIBUTION USING ATTRIBUTES OF VERSIONED HASH RINGS

(71) Applicant: Amazon Technologies, Inc., Seattle, WA (US)

(72) Inventor: Dylan Owen Marriner, Seattle, WA (US)

(73) Assignee: Amazon Technologies, Inc., Seattle, WA (US)

(*) Notice: Subject to any disclaimer, the term of this patent is extended or adjusted under 35 U.S.C. 154(b) by 222 days.

(21) Appl. No.: 15/720,670

(22) Filed: Sep. 29, 2017

(51) Int. Cl.
*H04L 12/24* (2006.01)
*G06F 12/0864* (2016.01)
*G06Q 10/06* (2012.01)
*G06F 12/1018* (2016.01)
*H05K 7/14* (2006.01)
*H04L 29/08* (2006.01)
*G06F 9/50* (2006.01)

(52) U.S. Cl.
CPC ...... *G06F 12/0864* (2013.01); *G06F 12/1018* (2013.01); *G06Q 10/06* (2013.01); *H04L 41/0893* (2013.01); *H04L 67/1012* (2013.01); *H05K 7/1485* (2013.01); *G06F 9/5027* (2013.01); *G06F 9/5061* (2013.01)

(58) Field of Classification Search
CPC ............. H04L 41/0893; H04L 67/1012; G06F 9/5027; G06F 9/5061
See application file for complete search history.

(56) References Cited

U.S. PATENT DOCUMENTS

| | | | | |
|---|---|---|---|---|
| 2008/0091806 A1* | 4/2008 | Shen | ...................... | G06F 9/5061 709/223 |
| 2013/0318244 A1* | 11/2013 | Yoon | ................... | H04L 41/0806 709/226 |
| 2014/0280819 A1* | 9/2014 | Gupta | ................... | G06F 9/5083 709/223 |
| 2015/0186187 A1* | 7/2015 | Weisberg | ............ | G06F 16/2379 707/747 |
| 2015/0350079 A1* | 12/2015 | Chen | ................... | H04L 45/7453 709/238 |
| 2016/0323197 A1* | 11/2016 | Guzman | ............... | H04L 47/726 |

\* cited by examiner

Primary Examiner — Jeong S Park
(74) Attorney, Agent, or Firm — Davis Wright Tremaine LLP

(57) ABSTRACT

A hash ring is used to determine and deploy configurations for a computer system for servicing customer requests. A worker manager managing a set of worker computing systems is deployed and associated with the hash ring. Various aspects of the computer system may be implemented according to configuration information for one or more attributes. Predecessor information is determined and used to obtain state information in connection with the configuration information.

18 Claims, 11 Drawing Sheets

RESOURCE DISTRIBUTION USING ATTRIBUTES OF VERSIONED HASH RINGS

BACKGROUND

Companies and individuals seeking to reduce the expense and overhead associated with maintaining their own computing resources have turned instead to purchasing remote computing services, such as remote program execution over multiple virtual machine instances and remote data storage, offered by computing resource service providers to customers. Such remote computing services are often configurable and scalable to meet various computing needs of the customers of the computing resource service provider.

In a large distributed computing system (e.g., multiple distributed data centers) of a computing resource service provider, various customers, users, services, and resources of the computing resource service provider are in frequent communication with each other. Balancing customer access to the computing resources and keeping the system secure becomes more challenging as the complexity and usage of the system increases. Customer utilization of resources in the distributed computing system may change over time, which may decrease characteristics of the system, such as efficiency and resource realization. Modifying the system to address customer utilization may pose a variety of challenging problems.

BRIEF DESCRIPTION OF THE DRAWINGS

Various techniques will be described with reference to the drawings, in which.

DETAILED DESCRIPTION

Figure 1:
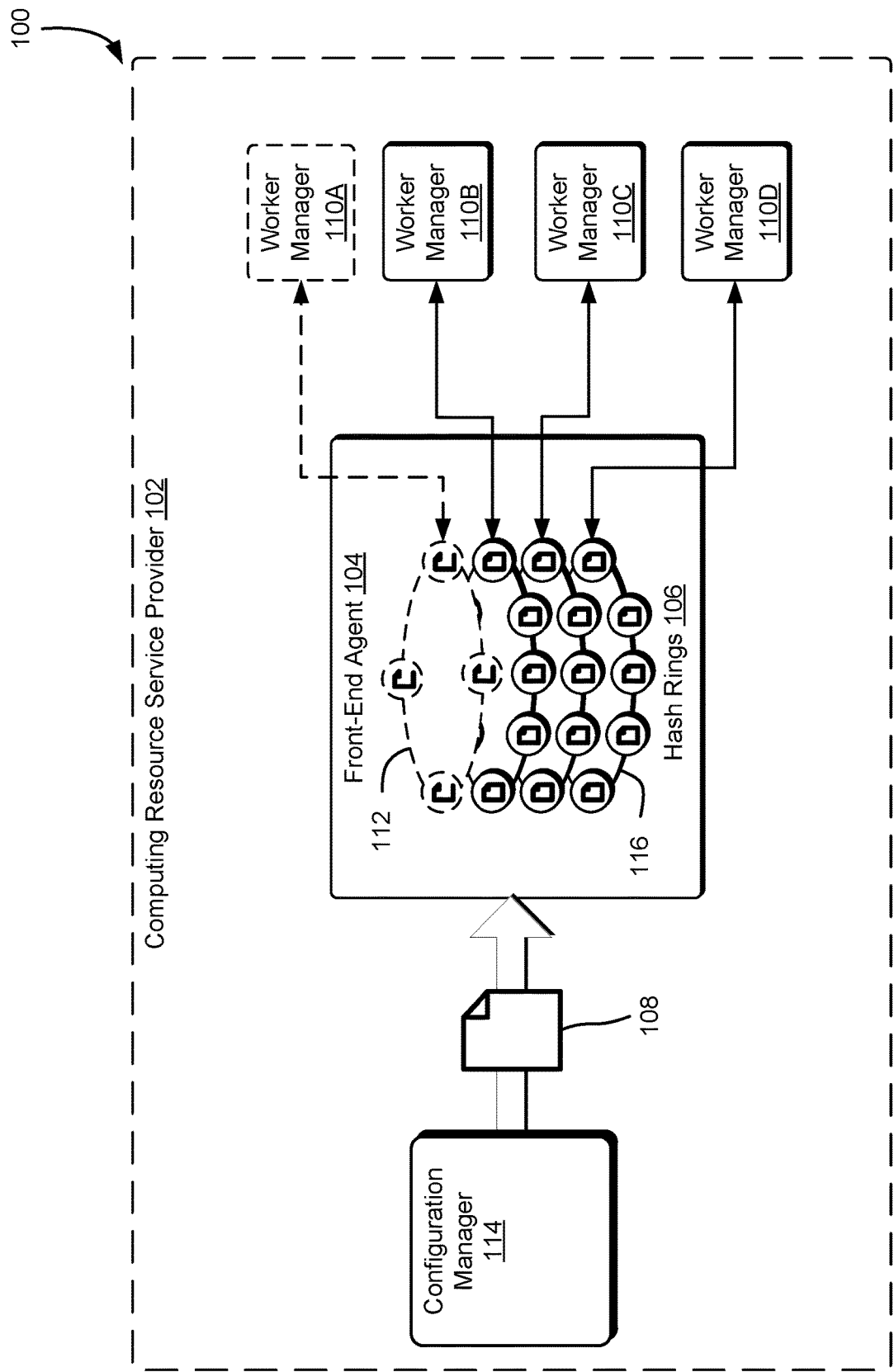
FIG. 1 illustrates an environment in which a hash ring may be used by a service front-end to facilitate activities of a worker manager in accordance with an embodiment.

Techniques described and suggested herein relate to servicing customer requests for computing resources provided by a computing resource service provider using a hash ring. The customer requests include various requests that may be routed or otherwise directed to one or more worker computer systems ("workers"). These workers include a variety of computing resources, including software, hardware, and a combination thereof, that processes or otherwise fulfils the customer requests. Worker managers are provided for routing customer requests to available workers for fulfillment based on state information associated with the worker.

For each customer that submits a request, information associated with the request (e.g., a customer identifier) is hashed to determine a position on the hash ring and particular services and/or computing resources are associated with portions of the hash ring. In some examples, a service front-end selects the closest service end-point and/or computing resource to the hash's (e.g., the hash of the customer identifier discussed above) position on the hash ring to handle the request. In order to prevent the loss of in-flight customer data (e.g., requests waiting or in the process of being fulfilled) or the loss of other state information, services and/or computing resources, described in greater detail below, are provided a mechanism for locating a predecessor (e.g., software containers or container agents responsible for processing the particular customer's request) and requesting that all state information be handed off from the predecessor to the new entity.

A front-end service or component thereof, such as a front-end agent, provides customers with access to the service endpoints (e.g., computing resources responsible for processing customer requests). In addition, the front-end service maintains a stack of immutable hash rings used to route customer requests to particular service endpoints. A hash ring is considered to be immutable when the positions or ranges within the hash ring are fixed such that the hash of a value will always point to the same position or range every time the value is hashed (e.g., the same customer's request will all ways point to the same position on the hash ring based at least in part on a hash of the customer identification number). When there is a change to the host topology (e.g., software deployments, refilling a pool of software containers, replacing failed software containers, hardware deployments, etc.), a new hash ring associated with the change to the host topology is created and pushed onto the top of the stack of hash rings. A previous version of the hash ring (e.g., a version not at the top of the stack) may be retrieved to determine which computing resource was previously responsible for handling a particular customer's requests.

When receiving a customer request, a new worker manager or other computing resource responsible for managing and/or directing requests to the appropriate service endpoint will be informed by the service front-end or other entity transmitting the request to the new worker manager of an associated predecessor responsible for handling the particular customer's request in the previous version of the hash ring. In response to a request from the new worker manager, the predecessor will cause a transfer of any requisite state information from the predecessor to the worker manager. In some embodiments, transferring the requisite state information includes transferring ownership and/or control of the service endpoint (e.g., computing resources responsible for processing the particular customer's requests) from the predecessor worker manager to the new worker manager. The new worker manager will then handle any unprocessed or incomplete customer requests. Once the predecessor worker manager has provided or offered the state information, the predecessor worker manager will remove the state information from internal storage, ensuring that the new worker manager has exclusive use of the state information it received from the predecessor.

Techniques employed in various embodiments described herein reduce the impact on customers as a result of changes in system topology such as deployments. In addition, maintaining the versioned hash ring enables simpler rollback to previous software containers and container agents. They also reduce customer latency when providing customer requests. Upon receiving a customer request to perform a particular operation, a front-end service may determine, according to a placement scheme and/or the hash ring, which computing resources to process the request. In some cases, the computing resource service provider provides a multi-tenant front-end service for determining where to perform certain operations, and in some cases the computing resource service provider may allow customers to provide and configure their own front-end service to customize how the front-end service operates. Customers may want different behaviors for different services. For example, a customer may want a computer service to maintain multiple levels of predecessor information to better trace application execution but may want a storage service to track only the more recent predecessor information to enable simpler storage of customer data.

In embodiments described herein, configuration information may specify settings for attributes associated with various aspects of the service provider. Based on performance characteristics of the system, such as efficiency or utilization, it may be desirable to change the attributes or parameters for new worker managers and workers being deployed, or of a new hash ring generated. It may be determined that adjusting the attributes or parameters may improve the characteristics for the system. However, deploying configuration changes to multiple aspects the system at once may cause unforeseen problems, such as causing customer outages. Accordingly, some of the techniques described herein include methods and systems for implementing per-unit attribute modifications associated with the system such that the configuration is implemented on each new deployment.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

FIG. 1 illustrates an environment 100 in which versioned hash rings 106 are used by front-end agent 104 of a computing resource service provider 102 to manage and facilitate activities of a worker manager 110 in accordance with an embodiment. The versioned hash rings 106 map customer requests to particular service endpoints managed by the worker managers. The term "hash ring", as described herein, refers to a plurality of nodes stored in data storage, such as in a set of servers in a distributed computer system. The nodes may be arranged in a circular structure wherein each node has a corresponding value stored in data storage such that each value defines a position in the circular structure. A lowest value in the ring may be adjacent to a highest value in the ring such that moving along the "ring" beyond the position corresponding to the highest value returns to the position corresponding to the lowest value, and visa-versa. As described below, each position on the hash ring may store a hash value produced as a result of performing a hash function using an identifier as an input.

As described in greater detail below, the service endpoints include computing resources, such as software containers, used to process customer requests. Information associated with the customer such as location, customer identification number, name, alias, e-mail address, or any other customer data may be hashed using one or more hash functions. Hashing the information associated with the customer may provide a unique identifier which may be used to associate and/or determine a particular service endpoint and/or computing resource used to fulfill customer's requests. The hash function may be any appropriate hash function known to those of ordinary skill in the art, such as an MD5 Algorithm, Keyed-Hash Message Authentication Code, Secure Hash Algorithm, or BLAKE, by way of non-limiting example.

The front-end agent 104, described in greater detail below, may receive requests from customers and other computer systems operated by the computing resource service provider 102. The front-end agent 104 may be a service and/or subsystem of various services offered by the computing resource service provider 102, such as a computing capacity provisioning service or other service of the computing resource service provider 102 (described in greater detail in connection with FIG. 5) which provides and manages software containers to customers.

As described in greater detail below, the computing resource service provider 102 may operate host computer systems organized into one or more data centers. The host computer systems may provide computing resources to execute various entities, such as the front-end agent 104, service endpoints, and worker managers 110. The service endpoints may include one or more computing resources (e.g., physical compute resources, virtual computing resources, and/or distributed computing resources) that implements services accessible via a network address associated with the service. Note that the service endpoints could comprise multiple devices (e.g., a combination of physical or virtual devices), such as in a configuration where the network address corresponds to a load balancer that routes traffic to a plurality of redundant servers.

The services provided by the computing resource service provider 102 may include a virtual computer system service, a block-level data storage service, a cryptography service, an on-demand data storage service, a notification service, an authentication system, a policy management service, a task service, and/or one or more other services, by way of non-limiting example. It is noted that not all embodiments described include the services described above, and additional services may be provided in addition to or as an alternative to services explicitly described. Furthermore, the computing resources of the various services may communicate with other computing resources of the computing resource service provider 102, customers, or other services through a network whereby the network may be a communication network, such as the Internet, an intranet or an Internet service provider (ISP) network.

Returning to FIG. 1, when the front-end agent 104 receives a request for computing resources or a request to execute a task, as described in further detail below, the front-end agent 104 may determine a particular worker manager 110 to process the request based at least in part on the versioned hash rings 106. The particular worker manager may be selected based at least in part on a range within the versioned hash rings 106 a particular attribute of the request hashes to. For example, an MD5 hash algorithm may be used to hash a unique customer identification number included in the request, and the resulting hash key may be within a particular range associated with a particular service endpoint which causes the front-end agent 104 to direct the request to the particular worker manager. The particular worker manager 110 may be responsible for fulfilling the customer request by causing one or more workers (e.g., service endpoints and/or computing resources) to execute one or more operations to fulfil the request. The versioned hash rings 106 may be maintained in a stack or other data structure such that the previous versions of the hash rings 106 may be associated with the latest version of the hash ring. In various embodiments, the front-end agent 104 maintains only two versioned hash rings 106 to enable the front-end agent 104 to associate the hash rings with the previous version.

In addition, the front-end agent 104 may then transmit the request to the worker manager 110 or may transmit a request (such as an appropriately configured application program interface (API)) to reserve or otherwise make available the worker manager 110 to process the request. The worker manager 110 will then either reserve or otherwise obtain computing resources or, if there is insufficient free capacity available (e.g., no unused or free software containers), obtain a new computing resource such as from a pool or collection of computing resources. In various embodiments, the versioned hash rings 106 are periodically or aperiodically updated. The versioned hash rings 106 may be updated or generated by the front-end agent 104, the front-end agent 104 may query or otherwise request membership information from a worker manager back-end described in greater detail below in connection with FIG. 3. The versioned hash rings 106 may be updated based at least in part on a set of worker managers managed by the worker manager back-end. For example, failed and/or failing worker managers 110 may be removed from set of worker managers by the worker manager back-end. Failed and/or failing worker managers 110 may be determined based at least in part on various health checks performed by the worker manager back-end.

In various embodiments, the worker managers 110 do not share state, data, software containers, or other computing resources. The worker managers 110 are mapped to nodes of versioned hash rings 106 which, as described above, may be used to distribute customers and/or customer requests between computing resources managed by the worker managers 110. In various embodiments, there are multiple worker managers 110 servicing multiple customers. Each individual worker manager may manage software, physical hardware, and other resource allocation in memory. In some embodiments, the worker managers 110 do not persist or store outside of memory the in-memory information associated with the resources managed by the worker managers 110. For example, an in-memory table of software containers managed by a particular worker manager will not be persisted and, therefore, would not be available after a new deployment causes a restart of the worker manager or restart of a physical host executing the worker manager. The term "deploy" or "deployment," as referred to herein, refers to the process of making an instance or object (e.g., worker, worker manager, hash ring, and other objects described throughout this disclosure) ready for use, such as by initiating a new configuration for a set of worker managers and/or workers. By way of further illustration, an instance or object is "deployed" when it is prepared and ready to be implemented for one or more functions for which it is designed.

In various embodiments, the new deployment causes replacement or updating to the worker managers 110 with new or updated computing resources. This may occur, for example, to update software associated with the computing resources or worker managers 110, or to modify the efficiency or performance of the system as a whole. Each new deployment (e.g., software update) may replace or update a set of worker managers, and may including generation of a new versioned hash ring (both the new worker manager 110A and a new versioned hash ring 112 is illustrated by dashed lines in FIG. 1). In some embodiments, computing resources associated with old/predecessor worker managers are returned to the pool of computing resources, and requests directed to the old/predecessor worker managers are redistributed to other worker managers indicated in the versioned hash rings 106. This may include the new worker managers associated with new computing resources.

Configuration information 108 may be provided that specifies one or more attributes to be associated with a hash ring, worker manager, and/or worker, and may include information for the one or more attributes. The one or more attributes, for instance, may correspond to limits on a number of concurrent requests associated with nodes of the hash rings, a number of nodes of a hash ring, or configuration information of worker managers or workers associated with a hash ring. The one or more attributes may be associated with the one or more hash rings may define attributes other than the hash values for each node, as described below in greater detail. The configuration information may be provided by any appropriate entity, such as a configuration manager 114 that generates the configuration information 108. The configuration manager 114 may be a computer system of the service provider 102 that the front-end agent 104 recognizes as being authorized to define configurations associated with the hash rings 106. The configuration manager 114 may generate the configuration information 108 based on input provided by an authorized user, or from another system having authority to define information for the one or more attributes. The new versioned hash ring 112 may have, or be associated with, one or more attributes different than previous versioned hash rings 116. In one embodiment, the configuration information 108 associated with the new versioned hash ring 112 may include an attribute and information associated therewith that cause the front-end to generate the new versioned hash ring 112 having a specified number of nodes. In one embodiment, the configuration information 108 associated with the new versioned hash ring 112 may include an attribute and information associated therewith that cause the worker manager 110A associated with a node of the new versioned hash ring to have an attribute specifying an upper limit for a load the worker manager 110A may accept.

Figure 2:
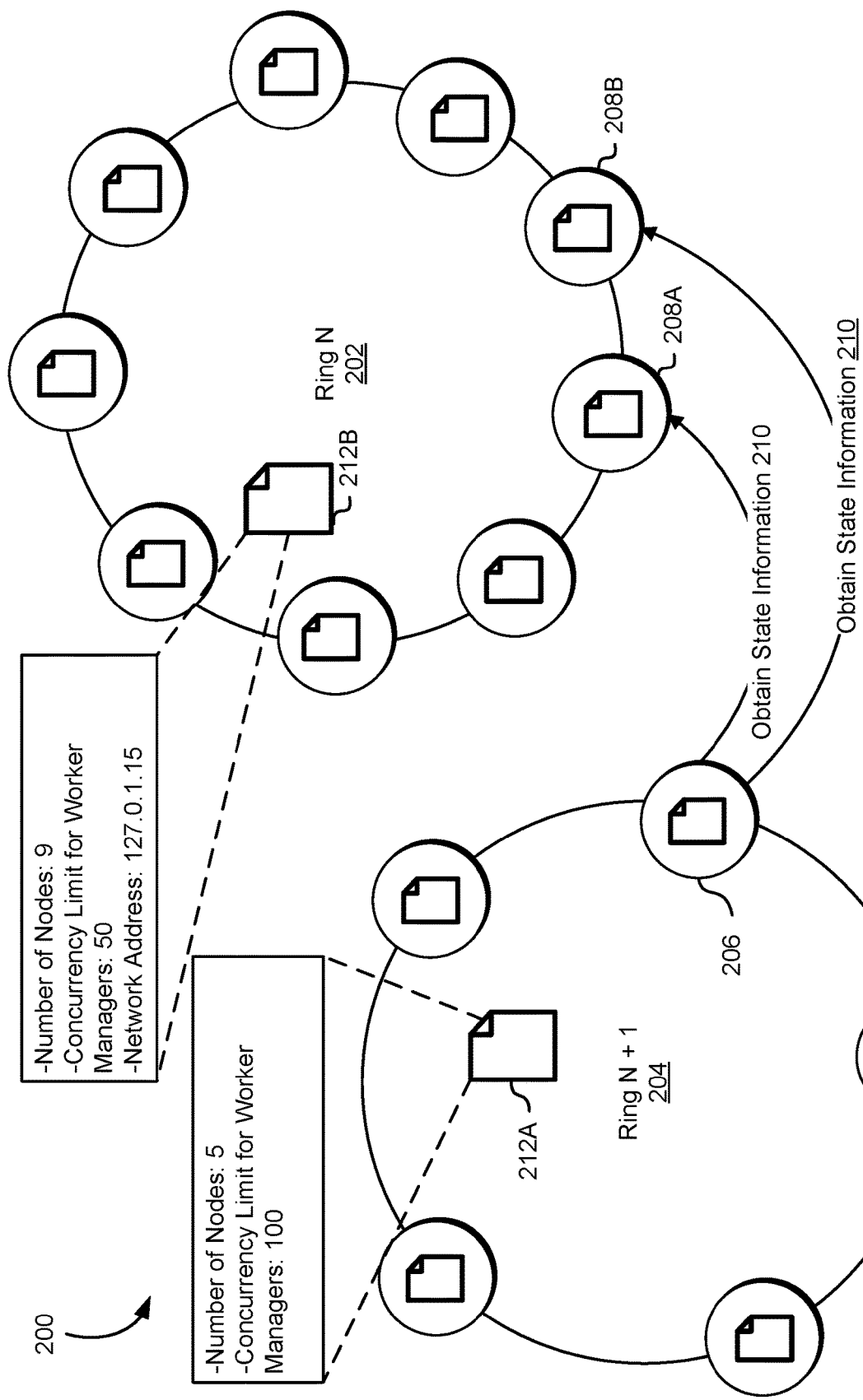
FIG. 2 illustrates an environment in which a hash ring may be used to obtain state information in accordance with an embodiment.

FIG. 2 illustrates an environment 200 in which a hash ring is used to process requests in accordance with an embodiment. As described above, a front-end service or other component, subsystem, or service may maintain hash rings to determine a particular physical host or other computing resource to process a particular customer request. Two hash rings are show in FIG. 2 for the purpose of illustration and explanation, but any number of hash rings may be used in accordance with the present disclosure. A first hash ring is labeled "Ring N" 202. Ring N 202 represents a predecessor or previous hash ring used to distribute customer requests. Each member of the Ring N 202 represents a computing resource (e.g., software container, virtual machine instance, or other worker) which may be used to process and/or fulfil requests. In addition, the computing resources that are members of the Ring N 202 may be executing a task definition, software, or other executable instructions on behalf of the customer.

A second hash ring, "Ring N+1" 204, representing a new hash ring is also depicted in FIG. 2. Ring N+1 204 may be associated with a different set of computing resources than the computing resources associated with the Ring N 202. The different set of computing resources may be a new set of computing resources, and may include a variety of computing resources as described above, which are being added to the set of computing resources used to process and/or fulfill customer requests. For example, the set of different computing resources can include a set of software containers of a container instance executed by a physical host which is being added to a fleet of container instances used to process requests. In yet other embodiments, the set of new computing resources simply includes existing computing resources which have been updated by a software deployment.

As described above, a front-end service or component thereof, such as a front-end agent, is responsible for maintaining the stack of hash rings. For example, the front-end service may generate the hash rings and provide the hash rings to the worker managers for request processing purposes. In some embodiments, a worker manager back-end detects topology changes to the set of computing resources used to fulfill customer requests and generate the new hash ring which is then provided to the front-end service. A topology change or other change to the computing resources used to process customer requests (e.g., software deployment to one or more hosts) may, as a results of being detected by the service front-end, cause the service front-end to create a new hash ring and push it onto the top of a stack of hash rings. The set of hash rings may be maintained in a variety of data structures such as a list, ring, table, or other data structure suitable for maintaining versioned information. Furthermore, any previous version of a hash ring (e.g., a hash ring not on the top of the stack) may be retrieved to determine various information, such as which worker manager was previously responsible for handling requests for a given customer.

When receiving a request from a front-end, a new worker manager (indicated as being associated with a node 206 of the N+1 hash ring 204) may be informed of a set of predecessor worker managers (indicated as being associated with nodes 208 of the new hash ring) that were responsible for handling traffic based at least in part on a previous hash ring version (e.g., N hash ring 202). A new worker may not be allocated sufficient computing resources upon startup to process the customer request. In the event that the new worker manager has insufficient capacity to reserve computing resources required to process the customer request, it may query the set of predecessor worker managers (e.g., worker managers associated with nodes 208) using one or more requests to obtain state information 210. The request to obtain state information 210 may be an Application Programming Interface ("API") call described in greater detail below. In some embodiments, the computing resources provided by a single predecessor container agent will have sufficient free capacity for processing the request. In one embodiment, the new worker may obtain the computing resources provided by a plurality of predecessor containers. However, if no such computing resource is available, a computing resource without sufficient capacity may be alternatively provided. For example, receiving a software container with insufficient capacity may result from a particular customer hitting a concurrency limit (e.g., a limit on a number of concurrent requests that may be maintained by worker managers for software containers) and is therefore being throttled, such as providing a lower resource bandwidth.

Configuration information 212 may be associated with the N ring 202 and/or the N+1 ring 204. The configuration information 212 may be provided by an authorized entity, such as a computer system operated by a developer or system administrator. The configuration information 212B may be information used by a front-end agent to generate the N ring 202, and may be associated with the N ring 202. The configuration information 212B may include parameters for the hash ring, parameters for worker managers, or other parameters that affect the one or more operations executed to fulfill customer requests. The configuration information 212B, for instance, specifies a parameter "number of nodes" for the N ring 202 is nine, a concurrency limit for worker managers associated with the nodes of the N ring 202 is 50, and a network address associated with the worker managers associated with nodes of the N ring 202 is 127.0.1.15. Similarly, the configuration information 212A may be information used by a front-end agent to generate the N+1 ring 204, and may be associated with the N+1 ring 204. Although the configuration information 212A specifies some of the same parameters of configuration information 212B, the information specified may be different—for example, the number of nodes in the N+1 ring 204 is five instead of nine, and the concurrency limit for the worker managers is 100. Accordingly, the N+1 ring 204 has five nodes instead of the nine nodes of the N ring 202, and the concurrency limit for worker managers corresponding to the nodes is 100 in the N+1 ring 204 versus the 50 concurrency limit in the N ring 202.

The parameters in the may affect performance of operations associated with the hash rings. In one embodiment, a value for the concurrency limit may affect how worker managers associated with nodes of one hash ring obtain computing resources from worker managers associated with nodes of another hash ring. For instance, the worker manager associated with the node 206 may attempt to obtain state information 206 from predecessor worker managers associated with nodes 208A and 208B of the N ring 202. However, the concurrency limit for worker managers for the N+1 ring 204 is greater than (e.g., double) the concurrency limit for worker managers of the N ring 202. Accordingly, the worker manager for the node 206 may obtain state information 210 from a node 208A and a node 208B to obtain sufficient computing resources for processing requests for the customer associated with the node 206.

Once the set of predecessor worker managers for the nodes 208A and 208B of the N ring 202 has offered the computing resources to the new container agent as a result of the requests to obtain state information 210, the predecessor worker managers may remove the corresponding computing resources from a set of computing resources available to the predecessor worker managers. This may ensure that the new worker manager has exclusive use of the computing resources and/or state information obtained. If the predecessor worker managers are unable to provide computing resources, the new worker manager may obtain computing resources from a set or pool of available computing resources. The computing resources obtained from the set or pool of available computing resources may have no associated state information.

Using this process the new worker manager associated with Ring N+1 may obtain a sufficient amount of computing resources such that the new worker manager may direct customer requests to computing resources managed by the work manager to be processed. In some embodiments, the requests may be maintained in a queue until such time as that can be processed by the new worker manager and directed to computing resources for fulfilment. Furthermore, once the new worker manager has sufficient capacity to serve requests, the predecessor worker managers may be decommissioned (e.g., the computing resources used to execute the predecessor worker manager may be made available to perform other operations) and the previous version of the hash ring may be deleted or removed as well. In addition, the container manager back-end or other system or service of the computing resource service provider may terminate or reallocate any computing resources associated with the predecessor worker managers that have not otherwise been allocated to other worker managers.

As an example, obtain state information function may be:

```
public class AdoptWorkerResponse {
    String az;
    String instanceId;
    String workerAddress;
    String customerId;
    int totalMemMb;
    int maxEnis;
    List<Eni> attachedEnis;
    List<Sandbox> idleSandboxes;
    List<Sandbox> busySandboxes;
}
AdoptWorkerResponse adoptWorker(String idemopotencyToken,
    Long currentRingVersion, InvokeConfig invokeConfig)
    throws InsufficientCapacityException;
```

The idempotency token illustrated above may be used to allow a worker manager to retry requests to obtain state information 210. The idempotency token may be a unique identifier, such as universally unique identifier (UUID), generated by the computer system which generated requests to obtain state information 210. Once the new worker manager and associated hash ring is generated, the front-end service may attempt to discover the most recent hash ring (e.g., the hash ring associated with the new worker manager) and direct requests and other traffic to the new worker manager. The front-end service may be queried for the last hash ring version number(s) discovered, and the worker manager back-end may provide the front-end service with the most recent hash ring version number.

Once requests and other traffic are directed to the new worker manager, the new worker manager may attempt to obtain state information 210 from one or more predecessor worker managers. In various embodiments, a safety interval (e.g., one hour) is required to expire before one or more predecessor worker managers may be terminated. This process may also be used to scale up or otherwise increase computing capacity. In such scaling scenarios, the one or more predecessor worker managers are not terminated and are used to provide additional computing capacity.

Furthermore, because the hash rings are immutable, rollback may be accomplished using the same or similar mechanism. For example, a Ring N+2 may be created that is identical to Ring N 202, and the predecessor worker manager may then transmit the request to obtain state information 210 to the new worker manager. Failed worker managers and/or hosts executing the failed worker manager may be added to a blacklist and ignored in the hash rings and will not cause the front-end service to generate new hash rings associated with computing resources contained in the blacklist. The hash rings may include metadata that indicated a version number of a particular hash ring. Configuration information may also be associated with a particular hash ring, such as being stored in a data store in association with an identifier of the hash ring. The configuration information for a hash ring may be compared with the configuration information for another hash ring to roll back or forward to a next or previous version of the hash ring. When transmitting requests to a worker manager, the front-end service may include the highest known and/or latest hash ring version number and a hash-key (e.g., a hash of customer identification information) used to determine the worker manager to process the request. The worker manager will use the information provided in the request to determine whether to obtain state information 210 from a particular predecessor worker manager.

As described above, requests to obtain state information 210 may be an API call enabling the new worker manager to obtain a software container or container instance from the particular predecessor container agent or from a plurality of predecessor container agents. The request to obtain state information 210 may cause the current state of all computing resources associated with the particular predecessor worker manager to be transferred at the time of the response to the request to obtain state information 210. The request to obtain state information 210 may ensure a view of the state information at the time of the request by locking the computing resources or otherwise preventing modification or operation of the computing resources. In one embodiment, the worker manager receiving the state information may be a member of a hash ring with a higher version than the worker manager providing the state information.

An example of a function for reserving computing resources may be:

```
def reserve_sandbox(ring_version, customer_id, invoke_config):
    if has_capacity(invoke_config):
        return reserve_sandbox_local(invoke_config)
    previous_worker_manager=
get_worker_from_ring(ring_version-1, customer_id)
    if previous_worker_manager:
        adopt_succeeded=
adopt_worker(previous_worker_manager, ring_version,
idempotency_token, invoke_config)
        if adopt_succeeded:
        return reserve_sandbox_local(invoke_config)
    claim_worker_from_warming_pool(invoke_config)
    return reserve_sandbox_local(invoke_config)
```

When a computing resource and/or associated state information is adopted or otherwise provided to the new worker manager, some of computing resources may be busy (e.g., in the process of executing a function, task definition, or other executable code). The worker manager may then maintain a connection to the computing resource waiting to be informed that the computing resource is no longer busy. For example, one way of determining when a busy computing resource has become idle is to wait for an execution timeout, at which point the computing resource will be idle.

Figure 3:
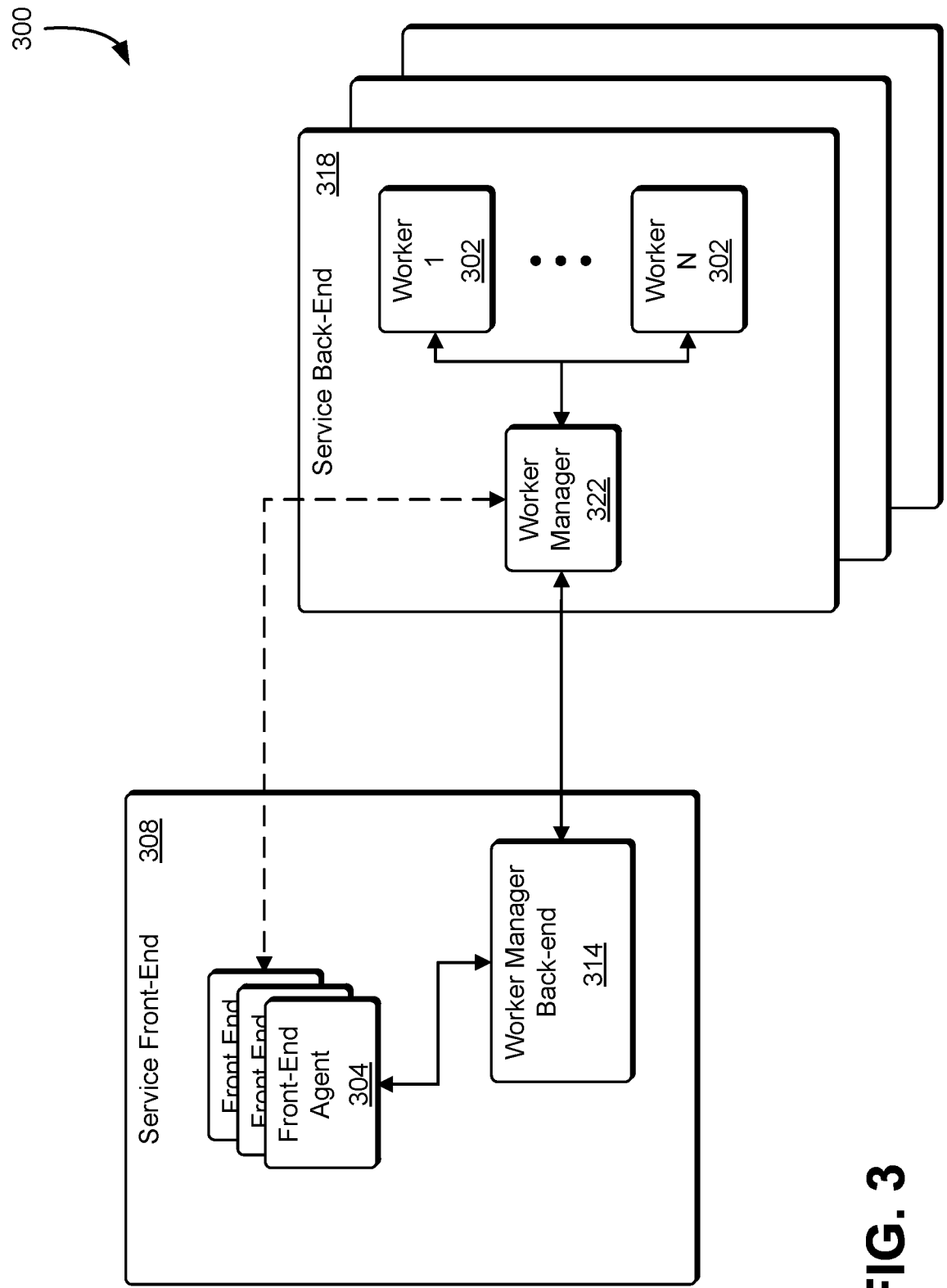
FIG. 3 illustrates an example of a service front-end distributing requests to a worker manager in accordance with an embodiment.

FIG. 3 illustrates an aspect of an environment 300 in which an embodiment may be practiced. As illustrated in FIG. 3, the environment 300 may include a set of workers 302 launched within service back-end 318 being monitored by a worker manager 322. The worker manager 322 may communicate information to a service front-end 308 and a worker manager back-end 314. Customers of a computing resource service provider, communicating through the front-end agent 304, may submit requests to one or more workers 302 executed by host computer systems within the service back-end 318. The service back-end 318 may include a variety of physical and virtual computing resources organized into a logical grouping of computing resources used to provide computing resources to customers of the computing resource service provider. The workers 302 may be individual computing resources or logical grouping of computing resources within the service back-end 318. Examples of workers 302 include software containers, virtual machine instances, load balancers, storage instances, database instances, network appliances, or other computing resources used to process customer requests. The service front-end 308 may provide an interface for customers to provide requests. For example, one or more front-end agents 304 may receive customer requests and direct the customer requests to the worker manager 322 based at least in part on a hash ring as described above.

In one example, a container encapsulation system operated by the service back-end 318 provided by or interfaced to the service front-end 308 may allow a customer to configure one or more applications within a container of an operating system which supports containers. The running processes and resources within the container may be isolated from other processes of the parent container instance and from the running processes and resources within other containers of the same host system. The customer may specify the amount of memory and processing capacity allocated to the container. The base container and the applications and data within it may then be packaged as an image, including one or more programs, data, and any system dependencies (e.g., libraries, files, etc.) that are needed for the programs to run on the operating system of the container instance. In some examples, an "image" may refer to an entire copy of a particular state of the base container at the time the image was generated. The image thereafter may be used to launch one or more identical containers, each of which may be assigned the specified amount of resources and may be isolated from each other. The containers may be launched on the same or different physical machines, and each container may be expected to run in exactly the same way as the base container. The containers described above are one example of the workers illustrated in FIG. 3 which may be managed by the worker manager 322.

In addition to the front-end agent 304 and the worker manager back-end 314, the service front-end 308 may include other services or computer systems not illustrated in FIG. 3 for simplicity, including a template service, a scheduling, a router service, a telemetry service, and other services to process customer requests. Because the service front-end 308 may be configured as a multitenant service (i.e., the resources of the service front-end 308 may serve multiple customers concurrently), and because the services provided by the service front-end 308 exist outside and separate from the workers 302, the customers need not install individual software applications within their respective workers 302 to provide the functionality afforded by the services. The customers may utilize the functionality provided by these services by making web service application programming interface function calls through the front-end agent 304, which may be configured to receive requests from the customers and forward the requests to the appropriate service, such as the appropriate worker manager back-end 314 or worker managers 322.

The worker manager back-end 314 may be a computer system that launches workers 302 and worker managers 322 within various environments, such as a virtual private cloud. The worker manager back-end 314 may be an intermediary between the front-end agent 304 and components of the service back-end 318 that receives and sends communications (e.g., requests) to the appropriate entities. For instance, the worker manager back-end 314 may receive customer requests provided to the front-end agent 304, and may distribute instructions for fulfilling the requests to the appropriate worker manager 322 and/or worker 302. The worker manager back in 314 may receive, from the service back-end 318, communications regarding the status of a request submitted, and provide communications regarding the status to the front-end agent 304. In one embodiment, the front-end agent 304 may communicate with the worker managers 322 and/or workers 302 without using the worker manager back-and 314 as an intermediary. In some embodiments, the workers 302 may be configured to communicate with other services of the computing resource service provider, such as block-level data storage services and/or on-demand data storage services. In some cases, workers 302 may be configured to share attached services with other workers 302. As an example, a worker associated with a customer may be mapped to a block-level storage volume of a block-level storage service of a computing resource service provider, and the other workers associated with the customer and/or worker manager 322 may each be configured to be able to read from and/or write to the block-level storage volume. In some examples, the block-level storage volume may be shared between multiple workers 302, such as all workers 302 managed by the worker manager 322. Although the service back-end 318 is illustrated as being comprised of single worker manager 322, individual of the service back-end 318 may include a plurality of worker managers 322 each managing one or more workers 302.

The workers 302 may be running virtualization instances (also referred to as tasks) of varying lifespans (e.g., short-term batch jobs, long-term background processes, etc.) that have been isolated from other processes within the service back-end 318. Metrics about the workers 302 may be gathered, aggregated, and provided to the service front-end 308. The worker manager 322 acts as a go-between between the workers 302 and resources, services, and other entities outside the namespace of the workers 302. In some implementations, the workers 302 may be configured to share external resources, such as block-level data storage volumes. In some of these implementations, access to and communication with the shared external resources by the workers 302 may be made through the worker manager 322. In other implementations, the service back-end 318 or operating system of the workers 302 may support allowing the workers 302 to access or communicate with the shared resources without going through the worker manager 322.

In various embodiments, when the service back-end 318 is instantiated, its worker manager 322 updates the service front-end 308 with information indicating that the workers 302 are available for processing request on behalf of a customer. For example, the service front-end 308, or component thereof such as the worker manager back-end 314, may generate a hash ring as described above and provide the hash ring to the front-end agent 304. Thereafter, if a request to launch a worker 302 or utilize a worker 302 to perform a task is received through the front-end agent 304 from the customer, the service front-end 308 may select the worker manager 322 to cause the worker 302 to fulfill the request based at least in part on the hash ring. The hash rings as described above may be used to associate and otherwise determine which worker 302 and/or worker manager 322 to execute a particular customer task. In addition, a previous version of the hash ring may be used to obtain state information and/or a worker 302 from another worker manager (e.g., the predecessor). If one of the workers 302 malfunctions and/or ceases operation, the worker manager 322 may reference the hash ring to determine whether to re-launch the malfunctioning or inoperative worker 302 or obtain additional workers 302 from a predecessor.

The worker manager 322 may be a software application that is executed by virtual computer instances operated by the computing resource service provider and may act as an interface between their respective service and other services and entities, such as the worker manager back-end services 314. For example, the worker manager 322 may act as intermediaries between the running tasks of their respective operating systems and other entities and services such that all communication to or from a worker 302 passes through the worker manager 322. In this manner, the worker manager 322 may be configured to interpret and translate commands between the workers 302 and computer systems running within the service front-end 308. This may allow changes to be made to the particular computing resources without requiring updates to be made to various tasks; e.g., only the worker manager 322 may need to be updated to reflect the changes to the particular computing resource.

As noted, the worker manager back-end 314 may be configured to provide an environment for other processes supporting the workers 302 and service back-end 318. The worker manager 322 may be configured to provide lifecycle and health information about the workers 302 being monitored by the worker manager 322 to the service front-end 308. In some embodiments, communication between the workers 302 and outside components may be a one-way communication from the worker manager 322 to the outside components. In other embodiments, communication between the worker manager 322 and the other components is bi-directional.

Figure 4:
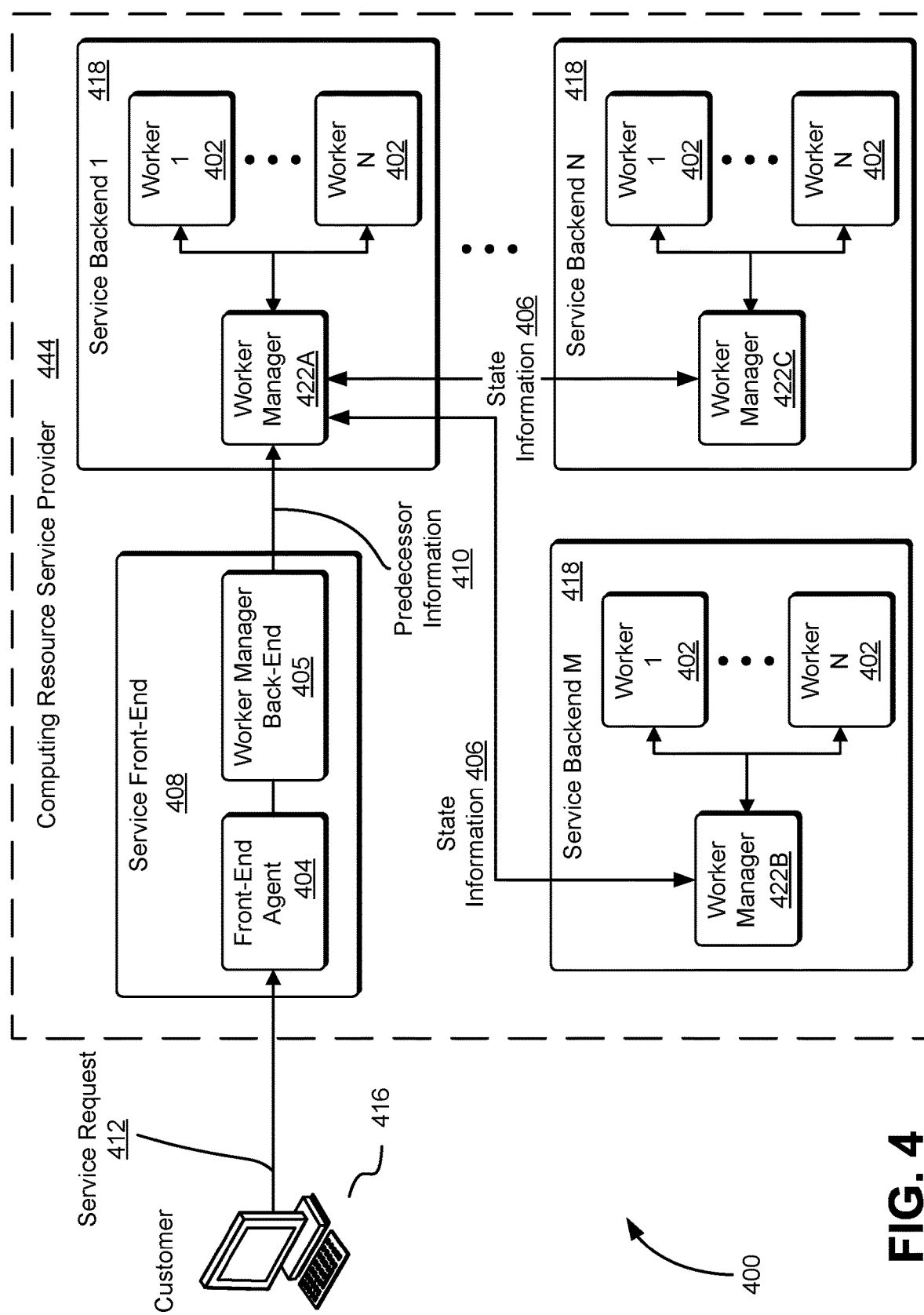
FIG. 4 illustrates an example of a service front-end providing predecessor information to a worker manager to enable the worker manager to obtain state information from a predecessor worker manager in accordance with an embodiment.

FIG. 4 illustrates an aspect of an environment 400 in which an embodiment may be practiced. As illustrated in FIG. 4, the environment 400 may include a set of workers 402 launched within one or more service back-ends 418 being monitored by a set of worker managers 422. The worker managers 422 may communicate information to a service front-end 408. A customer 416 of a computing resource service provider 444, communicating through the front-end agent 404, may submit service requests 412 to one or more workers 402 executed by host computer systems within a particular service back-end. The service back-end 418 may include a variety of physical and virtual computing resources organized into a logical grouping of computing resources used to provide computing resources to customers of the computing resource service provider 444.

The workers 402 may be individual computing resources or logical groupings of computing resources within the service back-end 418. Examples of workers 402 includes software containers, virtual machine instances, load balancers, storage devices, databases, network appliances, or other computing resources used to process customer requests. The service front-end 408 may provide an interface for the customer 416 to provide service requests 412. For example, one or more front-end agents 404 may receive service request 412 and direct the service request 412 to the worker manager 422 based at least in part on a hash ring as described above. The front-end agents 404 may provide the service request 412 to the worker manager 422 through a worker manager back-end 405, or may provide the service request 412 to the worker manager 422 without using the worker manager back-end 405 as an intermediary.

The customer 416 may provide the service request 412 through one or more communications networks such as the Internet, an intranet or an ISP network. In addition, the service request 412 may include information used by the front-end agent 404 to direct the service request 412 to a particular worker manager. For example, the front-end agent 404 may hash customer identification information included in the service request 412 and match the result to a range within the hash ring (e.g., a set of nodes of the hash ring, portion of the hash ring), the range corresponding to a set of particular worker managers designated for processing and/or fulfilling the service request 412. The service requests 412 may include various types of requests (e.g., read requests, write requests, service requests, or other request types). Furthermore, the service requests 412 may include API calls as described above.

The front-end agent 404 may transmit the service request 412 to the worker manager 422 along with predecessor information 410. The front-end agents 404 may provide the predecessor information 410 to the worker manager 422 through the worker manager back-end 405, or may provide the predecessor information 410 to the worker manager 422 without using the worker manager back-end 405 as an intermediary. The predecessor information 410 may be generated based at least in part a previous version of the hash ring. The predecessor information 410 may include an identifier, network address, configuration information, or other information which may be used by the worker manager 422 to obtain state information 406 from one or more other workers managed by another worker manager. As described above, the worker manager 422 may receive the service request 412 and determine if there is an available worker 402 to process the service request 412. A worker 402 may be available to process the service request 412 under a variety of different conditions, for example, if the worker has performed the same task in response to a previous service request. In another example, a worker 402 may be available if the worker 402 has sufficient state information to process the service request 412. In some embodiments, the state information may include an active software container used to execute a task definition provided by the customer as described in greater detail below.

If the worker manager 422 determines that a worker with the state information is not being managed by the worker manager 422 and not available to process the service request 412 the worker manager 422 may determine if a worker with the state information is available based at least in part on the predecessor information 410. As described above, the worker manager 422 may transmit a request, such as a service call, including information associated with the service request 412 to determine if the predecessor worker manager (e.g., worker manager 422 of service back-end M or service back-end N) manages a worker with the state information 406. If the worker with the state information is available, the predecessor worker manager may provide the worker and/or state information to the worker 402 to process the service request 412.

In some instances, the service provider 444 may generate and adopt a new hash ring that is associated with configuration information different than configuration of the preceding hash ring. Accordingly, the process for obtaining state information 406 may differ from the case in which configuration information matches for successive versions of the hash rings generated. As one example, a concurrency limit for the worker manager 422A for the service back-end 1 may be higher than a concurrency limit associated the predecessor worker managers 422B and 422C. The worker manager 422A may receive the predecessor information 410 to obtain state information 406 from predecessor worker managers. In one embodiment, the predecessor information 410 may include information corresponding to configuration information for the predecessor work managers, such as the number of nodes in the predecessor hash ring and the concurrency limit or limits associated with the nodes of the predecessor hash ring. The worker manager 422A may obtain the state information 406 based on the configuration information in the predecessor information 410—for example, by obtaining state information 406 from both the worker manager 422B and worker manager 422C to occupy its concurrency allocation. In another embodiment, the worker manager 422A may derive the information necessary to obtain the appropriate state information 406 to occupy its concurrency allocation by analyzing the configuration information associated with the preceding hash ring. The configuration information may be obtained from data storage storing the configuration information in association with information useable to identify a particular hash ring version, such as a version number, a time/date the hash ring was generated, or a unique identification number.

Figure 5:
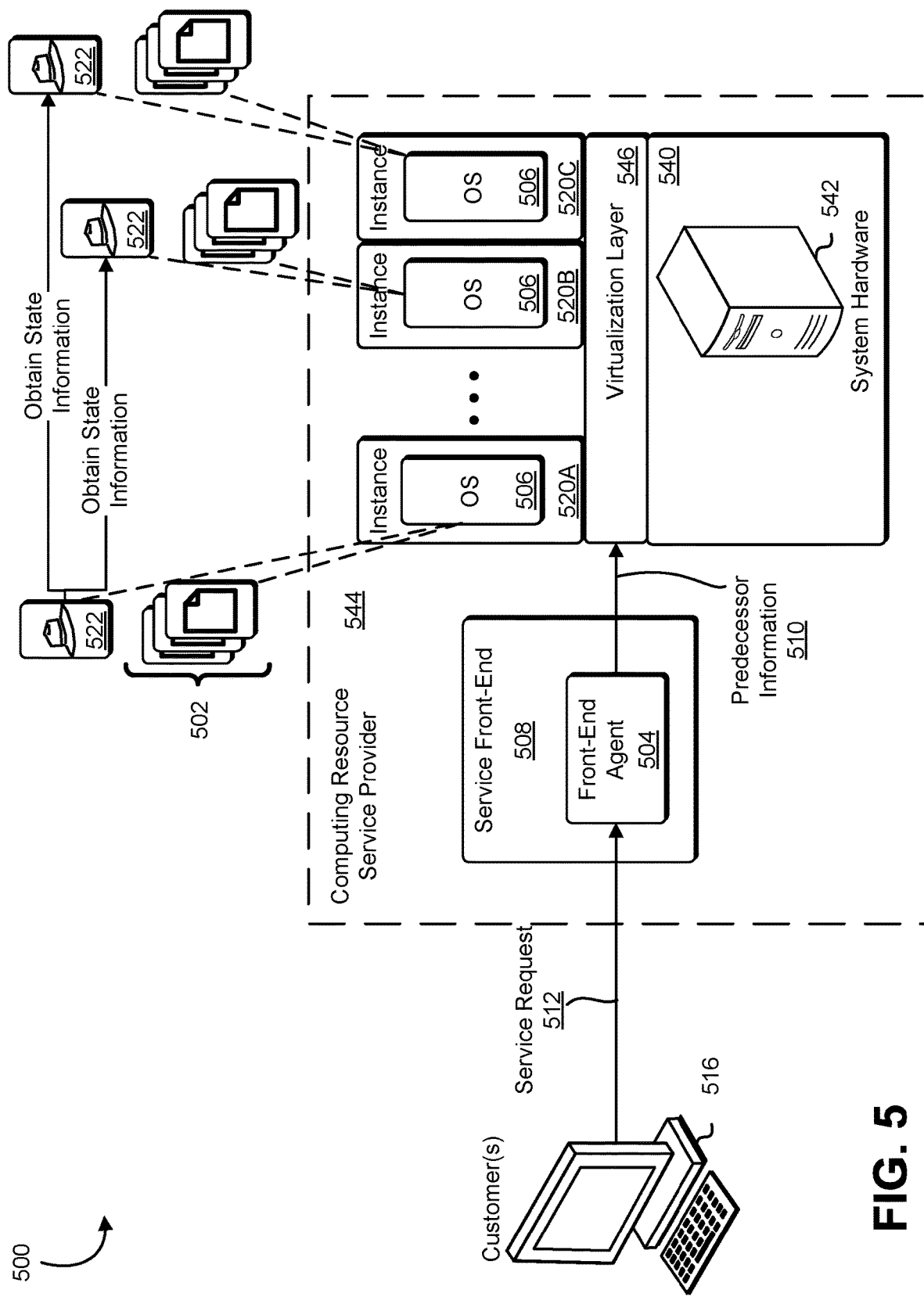
FIG. 5 illustrates an example of a service using hash rings in accordance with an embodiment.

FIG. 5 illustrates an aspect of an environment 500 in which an embodiment may be practiced. Specifically, FIG. 5 depicts a service executing a plurality of virtual machines configured as container instances 520 in accordance with at least one embodiment. The service may provide system hardware 540 to customers 516 of a computing resource service provider 544 providing the service to perform computation services within workers 502. The system hardware 540 may include one or more hosts 542, also referred to as host computer systems. Each of the hosts 542 may be any device or equipment configured to execute instructions for performing data computation, manipulation, or storage tasks, such as a computer or a server. The hosts 542 may be equipped with any needed processing capability, including one or more processors such as a central processing unit, a graphics processing unit, or a digital signal processor. The hosts 542 may also be equipped with memory (e.g., static and dynamic memory), buses, and input and output ports that are compliant with any handshaking, communications or data transfer protocol. The system hardware 540 may also include storage devices, such as storage disks and tapes, and networking equipment. The storage devices may be network storage devices managed by a data storage service. As described above in connection with FIG. 4, a customer 516 may submit a service request 512 to a front-end agent 504 of a service front-end 508.

Virtualization layers 546 in the system hardware 540 enable the system hardware 540 to be used to provide computational resources upon which one or more container instances 520 may operate. The virtualization layer 546 may be any device, software, or firmware used for providing a virtual computing platform for the container instances 520. The virtualization layers 546 executing on the hosts 542 enable the set of system hardware 540 to be used to provide computational resources necessary to support the container instances 520. Furthermore, the physical host 542 may host multiple virtualization layers of the same or different types on the same system hardware 540. Each container instance 520 may include various virtual computer components such as one or more virtual processors, virtual memory, and virtual storage. The container instances 520 may be provided to the customers of the computing resource service provider 544, and the customers may run an operating system 506 and applications on each of the container instances 520. An example of a virtualization layer 546 includes a hypervisor.

The workers 502 may be virtual machine instances that support containerization, and the workers 502 may be used by various customers 516 as needed to fit the needs of the customer. Each worker 502 may be managed by a worker manager 522 that performs various tasks with workers 502 and the software container instances 520, including registering worker 502, deregistering worker 502, starting tasks, stopping tasks, providing task statuses, signaling task heartbeats, and reporting task events. A worker manager, as referred to herein, may be a service implemented by a computer system that may, for instance, comprises one or more processors and memory that stores executable instructions whose execution by the one or more processors causes the computer system to perform operations described herein. The computer system may comprise one or more separate computing devices (e.g., servers, personal computers) including a processor and data storage. Examples of a worker manager may include a plurality of virtual machines configured as instances running in system hardware, or a physical host instantiated to run a process that performs the operations described above.

Workers 502 may include data and one or more processes that, as a result of execution in a computer system instance configured to support containerization, may be isolated from other processes running within the same computer system instance. In addition, a container manager back-end may be provided to determine a particular container instance or host to execute a customer request.

The workers 502 may be configured to run as tasks according to a task definition, and the task definition may be stored as a task definition file. The task definition file may describe one or more workers 502 that are assigned to start as a group. Software images of the workers 502, which may represent an entire copy of the particular state of the workers 502 at the time the software image was generated, that have been configured to execute within the workers 502, may be provided to the computing resource service provider 544 or their locations specified in the task definition. The task definition may also specify resource requirements, relationships between containers, network ports used, and shared resources, among other things.

Service requests 512 may be received by a front-end agent 504 such as the service front-end 508 of FIG. 5 operated by the computing resource service provider 544. The front-end agent 504 may direct the request to the appropriate worker manager 522. The front-end agent 504 may also transmit predecessor information 510, as described above, to the worker mangers 522. Each container instance 520 may include one or more worker managers 522. The worker managers 522 may be configured to allow the customers 516 to manage their respective workers 502 and other computing resource. The worker managers may be further configured to perform logging of events and gather telemetry data related to the workers 502 and container instances 520. A worker manager 522 for a new container instance 520A may obtain state information from worker managers corresponding to one or more predecessor container instances (e.g., instances 520B and 520C), as described above.

The operating systems 506 may be any operating systems suitable for running within the container instances 520 and that provide isolation technology that enable containerization schemes to isolate virtualization instances, such as the workers 502, from other processes running under the operating system 506. Examples of such operating systems include various implementations of Linux® operating systems that support resource isolation features in the Linux® kernel. As noted, the workers 502 may be virtualized instances within the operating systems 506 launched from application images in accordance with one or more task definitions and may be allocated resources from their respective container instances 520.

Figure 6A:
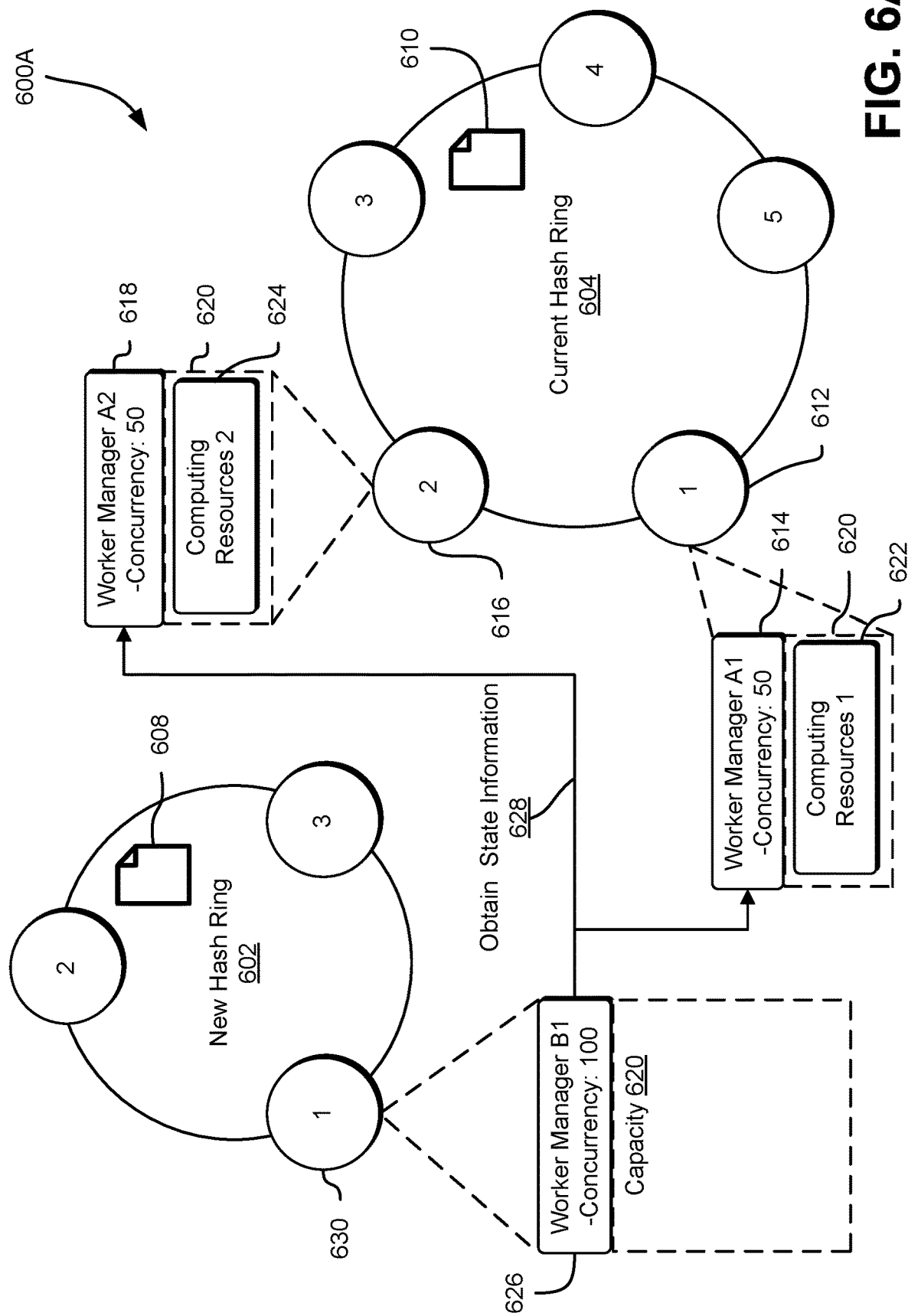
FIG. 6A illustrates an environment in which state information is requested using hash rings in accordance with an embodiment.
Figure 6B:
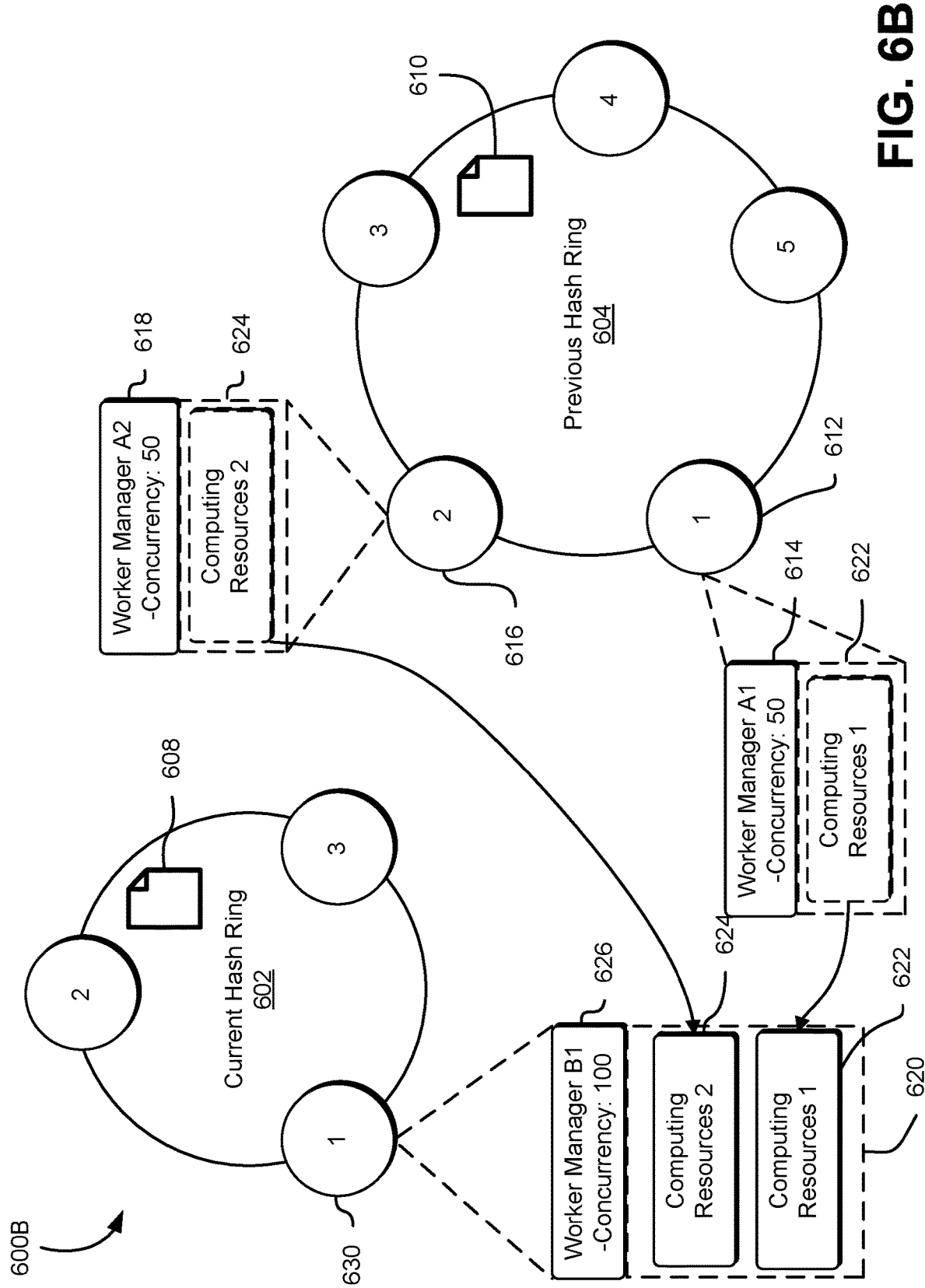
FIG. 6B illustrates an environment in which state information is obtained using hash rings in accordance with an embodiment.

FIGS. 6A and 6B respectively illustrate environments 600A and 600B in which hash rings are used to process requests in accordance with an embodiment. In the environments 600A and 600B, a front-end service or other component, subsystem, or service may maintain hash rings to determine a particular physical host or other computing resource to process a particular customer request. To increase utilization efficiency of the system—for example, if the worker managers for a customer, group of customers, or the entire system are underutilized—an authorized entity may decide to modify the concurrency limit for worker managers so that computing resources are evenly distributed. The authorized entity (e.g., developer, system administrator) may cause a front-end agent 606 to generate a new hash ring 602 based on configuration information 608 specified by the authorized entity. The new hash ring 602 may supersede a current hash ring 604 that is associated with configuration information 610 different than the configuration information 608. As described above, each node of the hash rings represent a computing resource (e.g., software container, virtual machine instance, or other worker) which may be used to process and/or fulfil requests. In addition, the computing resources corresponding to the nodes of the current hash ring 604 may be executing a task definition, software, or other executable instructions on behalf of the customer. Although only one front-end agent 606 is depicted in FIGS. 6A and 6B, the environments 600 may include a fleet of front-end agents that are configured simultaneously adopt a new hash ring.

The new hash ring 602 generated according to the configuration information 608 has a node count (i.e., number of nodes) of three and a concurrency limit of 100 for the worker manager corresponding to each node. By contrast, the current hash ring 604 generated according to the configuration information 610 has a node count of five and a concurrency limit of 50 for the worker manager corresponding to each node. A node count, as referred to herein, refers to the number of nodes of a hash ring. This is distinguishable from other aspects of a hash ring, such as the amount of space that a particular hash ring occupies in memory. A workload manager A1 614 corresponds to a first node 612 of the current ring, and a workload manager A2 618 corresponds to a second node 616 of the current ring 604. Each of the worker managers is depicted as having a capacity 620 that is proportional to the size of their respective concurrency limit. The worker manager A1 614 and the worker manager A2 618 respectively manage a first computing resource 622 and a second computing resource 624 occupying the majority of their capacities 620. The first and second computing resources 622 and 624 may correspond to service end points (e.g., computing resources responsible for processing the particular customer's requests).

When the new hash ring 602 is initially generated, computing resources are not assigned to the nodes. The worker manager B1 626 may send a request 628 to the worker managers 614 and 618 to provide state information for transferring ownership and/or control of the first and second computing resources 622 and 624. The first worker manager B1 626 may obtain ownership and/or control of the computing resources 622 and 624 corresponding to the state information thereby divesting the worker managers 614 and 618 of ownership and/or control of the computing resources 622 and 624. Accordingly, a first node 630 corresponding to the first worker manager B1 626 is matched with the hash of the customer identifier that was previously associated with the range of the hash ring 604 including the first node 612 and the second node 616. The front-end agent will therefore submit customer requests from a customer having the customer identifier to be fulfilled by resources controlled by the worker manager 626 associated with the first node 630 of the hash ring 602. After the worker manager for each node of the hash ring 602 obtains control and/or ownership of the computing resources previously assigned to the hash ring 604, the hash ring 602 becomes the current hash ring and the hash ring 604 becomes a previous hash ring.

Figure 7:
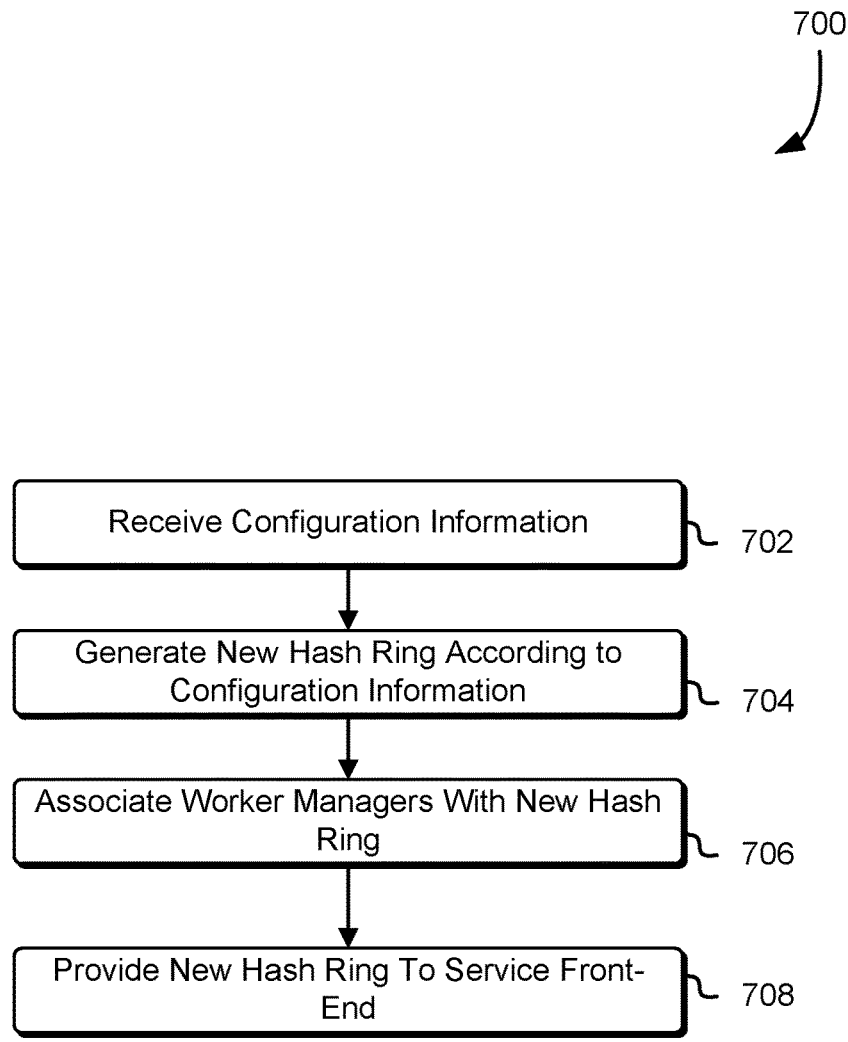
FIG. 7 illustrates a process which may be used to provide a versioned hash ring to a container agent in accordance with an embodiment.

FIG. 7 is a block diagram illustrating an example of a process 700 for generating a hash ring associated with a set of worker managers and/or workers in accordance with at least one embodiment. The process 700 may be performed by any suitable system such as a worker manager back-end, service front-end or other component of one or more services described above in connections with FIGS. 3-5. The process 700 includes receiving 702 configuration information to be associated with a hash ring, worker manager, and/or worker, as described above with respect to FIGS. 2-6. The configuration information may be provided by an entity authorized to modify the configuration of the system, such as a developer or system administrator. The configuration information may be stored in a data store and may be stored with metadata, such as a time that the configuration information was received and which entity provided it. Next, the system may detect a new deployment 702 that modifies the system, such as a change in the configuration information and/or the system topology. The new deployment may include any change to the computing resources of the one or more services as described above. For example, the addition or removal of a particular computing resource from a set of computing resources used to process customer requests. In another example, the new deployment may include a software deployment or software update provided to a particular computing resource used by the one or more services to process requests. The work manager back-end or other system performing the process 700 may detect the new deployment based at least in part on information obtained from a front-end service or other component of the one or more services as described above. For example, the configuration information may specify a resource usage limit, such as limit on the amount of load a worker manager is permitted to accept, a ring size for a hash ring, or network address of workers. A particular service may include a deployment management system which is responsible for coordinating and updating other components of the particular service during new deployments.

In response to receiving the configuration information, the worker manager back-end or other system performing the process 700 may then generate 704 a new hash ring according to the configuration information. As described above, the hash ring may be used to direct customer requests to a particular worker manager and/or worker responsible for fulfilling the customer request (e.g., execute a particular task indicated in the customer request). The new hash ring may be generated based at least in part on customer identification information or other information included in service request. In addition, the new hash ring may also be generated based at least in part on topology information, such as the location of the worker managers and/or workers within the computing resource service provider environment (e.g., the location of the physical hosts and networks supporting the container instances). Further, the new hash ring may be generated based on the configuration information, such as by generating a hash ring having a number of nodes specified in the configuration information.

The container manager back-end or other system performing the process 700 may then associate 706 the worker managers with the new hash ring. For example, worker managers may be mapped to particular nodes or portions of the hash ring such that, when directing service request, information in the service request is hashed to a particular portion of the hash ring associated with one or more worker managers mapped to the particular portion. This enables the front-end service to direct customer requests to the appropriate worker managers and/or worker as indicated by the hash ring. Associating the worker managers with the new hash ring may include deploying new worker managers having a configuration corresponding to the new configuration information, or updating the configuration of existing worker managers to correspond to the new configuration information. As described herein, workers associated or to be associated with the worker managers may also be updated or configured to correspond to the configuration specified in the new configuration information.

The worker manager back-end may provide 708 the hash ring to the front-end agent so that the service front-end can direct customer requests to the work managers. As described above, worker managers may be mapped to particular portions of the hash ring such that, when directing service request, information in the service request is hashed to a particular portion of the hash ring associated with one or more worker managers mapped to the particular portion. This enables the front-end service to direct customer requests to the appropriate worker managers and/or worker as indicated by the hash ring.

Deployment of a new configuration according to the new configuration information may include the creation of worker managers and workers as described above. In such scenarios, the new hash ring may be associated with the worker managers and used to route customer requests to the worker managers. As described above, the hash ring may also be used to adopt or otherwise obtain state information and other computing resources from other worker managers based at least in part on other versions of the hash ring. The container manager back-end or other system performing the process 700 may then provide 708 the new hash ring to the service front-end. The service front-end may request the latest version of the hash ring from the container manager back-end or other front-end services. Further, each service front-end may receive a new hash ring for each deployment of a new configuration. Mapping information may also be generated and associated with the new hash ring. The mapping information may specify one or more worker managers associated with a previous hash ring from whom to obtain state information in association with a request; for instance, a work manager for a node of the previous hash ring that corresponds to a node in the new hash ring.

Figure 8:
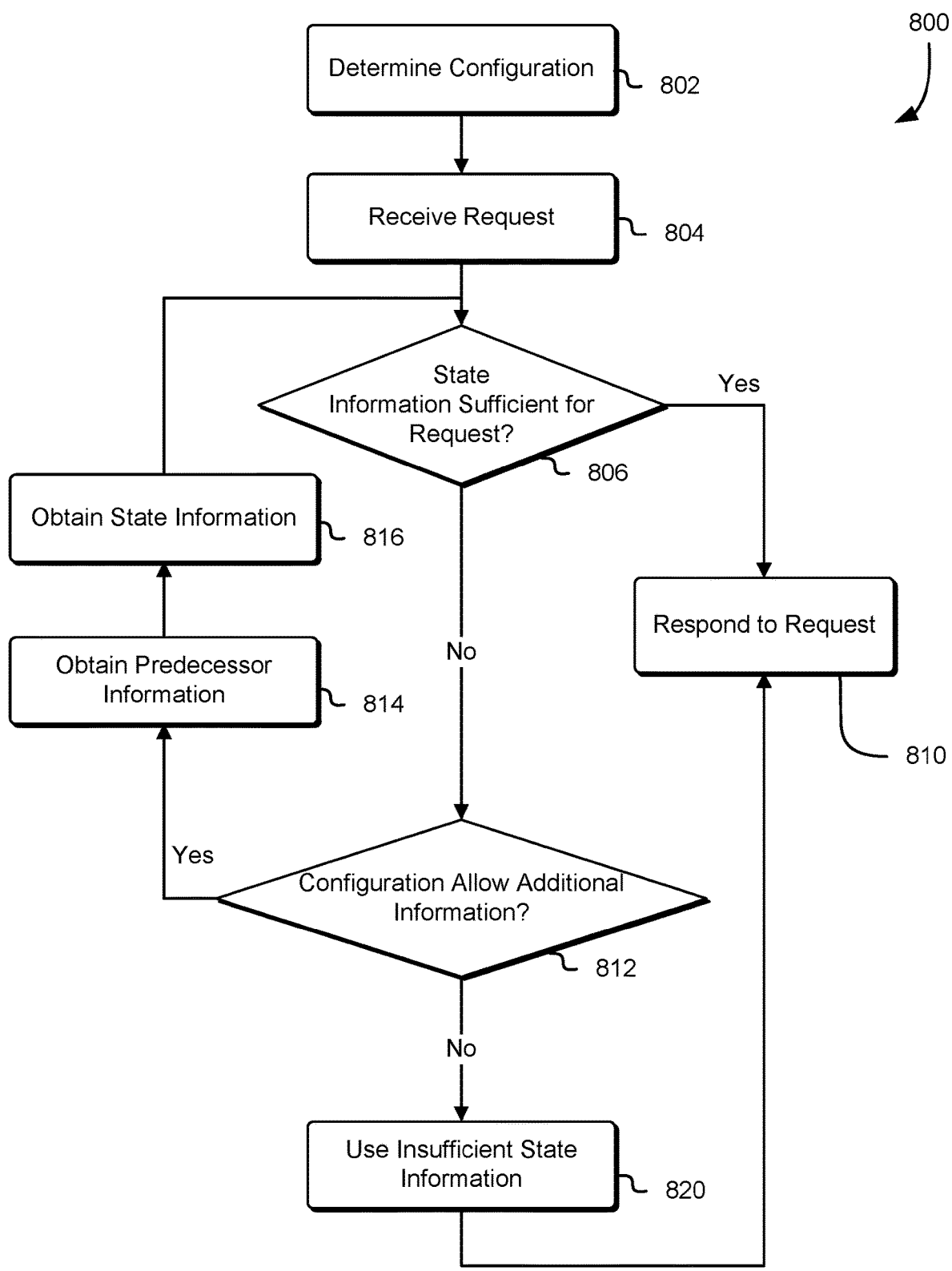
FIG. 8 illustrates an illustrative process which may be used to provide state information to a container agent in accordance with an embodiment.

FIG. 8 is a block diagram illustrating an example of a process 800 for fulfilling customer requests using workers managed by worker managers in accordance with at least one embodiment. The process 800 may be performed by any suitable system such as worker managers or other component of a service described above in connections with FIGS. 3-5. The process 800 includes determining 802 a configuration of the worker managers. The worker manager may determine a configuration in which it is currently operation—for example, a resource utilization constraint (e.g., concurrency limit) that the worker manager is set to not exceed. The worker manager may determine the configuration by reviewing configuration information provided by another entity, such as the front-end service, or performing a status check operation on itself. Next, the worker manager may receive 804 a request. The request may be a customer request to execute a particular task as described above. Furthermore, the request may be directed to the worker manager based at least in part on a current version of the hash ring.

The computer system executing the process 800 (e.g., worker manager) may then determine 806 whether the state information corresponding to the worker(s) under the control of the computer system is available and sufficient to successfully process the request. The state information may include a worker and associated data available to process the request and underlying physical resources which are provided to the worker as described above. For example, state information requires not only that there be a worker available (e.g., not currently processing another request) but that the physical host executing the worker has sufficient physical resources (e.g., processor and memory) to satisfy the requirements of the request and/or software container. In another example, the state information requires that the worker has information suitable for processing the customer request, such as a worker that has previously processed a request from the customer to execute the same or similar task. If the required state information is available and the state information, the worker manager may respond 810 to the request, for example, by causing the worker(s) corresponding to the state information to fulfill the request.

If the state information is insufficient to satisfy the request, then the computer system executing the process 800 may determine 812 whether the configuration information permits obtaining additional state information. For example, the worker manager may determine whether a resource utilization constraint will permit it to obtain additional state information. If the configuration information specifies that the concurrency limit is 100 (e.g., 100 concurrent requests that may be maintained), and the state information under its control would require 50 concurrent requests to be maintained, then the worker manager may determine that additional state information may be obtained.

If the configuration information allows for additional state information and/or predecessor information, the computer system (e.g., worker manager) will obtain 814 predecessor information from a front-end service for fulfilling the request. Predecessor information may be included in various versions of a hash ring as described above. For example, the predecessor information may indicate a particular worker and/or worker manager responsible for fulfilling or otherwise handling a particular customer's request. The predecessor information (e.g., the various versions of the hash ring) may be maintained by the service front-end or other component of the service as described above. The worker manager or other system executing the process 800 may then store the predecessor information for use in processing requests. The requests may be distributed by the service front-end and may include, in some embodiments, predecessor information, customer information, task information, and any other information suitable for fulfilling the customer request.

The worker manager or other system executing the process 800 may then obtain 816 the state information associated with the predecessor information. State information may include a worker and associated data available to process the request and underlying physical resources which are provided to the worker as described above. For example, state information requires not only that there be a worker available (e.g., not currently processing another request) but that the physical host executing the worker has sufficient physical resources (e.g., processor and memory) to satisfy the requirements of the request and/or software container. In another example, the state information requires that the worker has information suitable for processing the customer request, such as a worker that has previously processed a request from the customer to execute the same or similar task. The computer system may then cause the predecessor worker manager to provide the state information (e.g., transfer control of a worker with the state information to process the request). The worker manager may cause the worker to execute the particular task indicated in the request and fulfill the request.

Obtaining 816 state information from the predecessor may include adopting or otherwise obtaining access to a particular worker from a particular worker manager indicated in a previous version of the hash ring, for example, using the obtain state information request as described above. The worker manager or other system executing the process 800 may then determine if the predecessor (e.g., another worker manager indicated as the predecessor in the previous version of the hash ring) has sufficient state information to fulfill the request. State information may include worker, physical resources, and other computing resources as described above. If the predecessor has sufficient state information, the worker manager may obtain the state information using the adopted state information request as described above. Once the state information is obtained, the worker manager may then provide the state information to respond to the request. This may include executing a particular task indicated in the request as described above.

In the case that the state information is insufficient to fulfill the request, the worker manager or other system executing the process 800 may, in lieu of steps 814 and 816, cause new state information to be generated. Generating new state information may include a variety of operations including obtaining control of inactive resources, acquiring control of resources (e.g., resources having a lower priority), and/or initiating new resources to be instantiated (e.g., instantiating new virtual machines). This may include updating various components of the service, for example, indicating a particular worker and/or worker managers are no longer associated with the predecessor or are being taken from a pool. Generating the new state information may also include indicating that the particular worker is now associated with a new worker manager.

If, in step 812, the configuration is insufficient to allow obtaining additional state information, then the worker manager may use insufficient state information 820 to fulfill the request. This may include providing a worker without the required state information (e.g., a worker that has not previously processed the task on behalf of the customer). In addition, providing insufficient state information may include queueing or otherwise delaying processing of the request. Finally, providing insufficient state information may also include obtaining the insufficient state information from the predecessor. The computer system executing the process 800 may respond 810 to the request by using the insufficient resources to fulfill a portion of the request. Responding 810 to the request may include providing a notification that the worker managers have an insufficient allocation of resources to complete the request.

Figure 9:
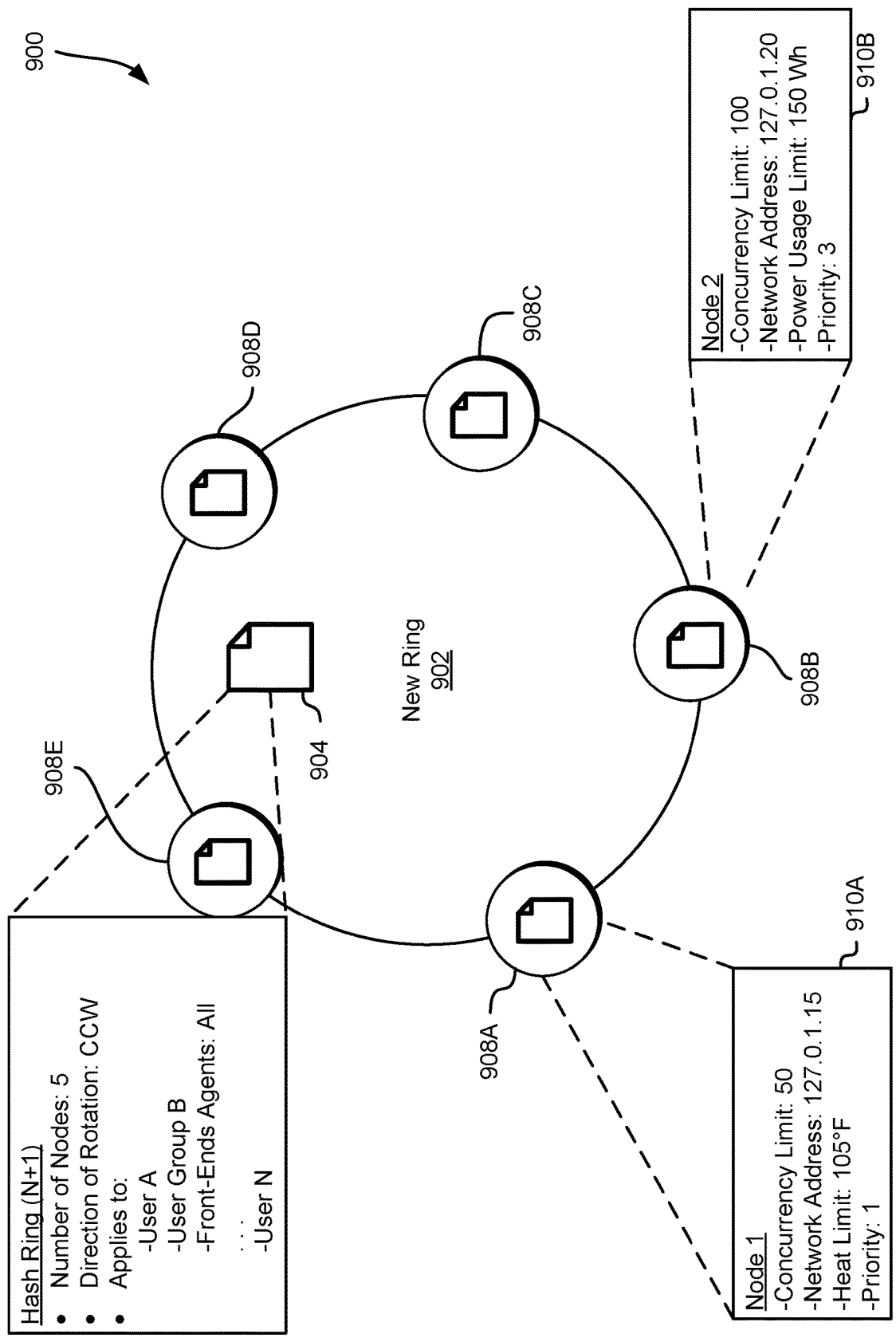
FIG. 9 illustrates an environment in which a hash ring may be used to obtain state information in accordance with an embodiment.

FIG. 9 illustrates various aspects of an environment 900 in which a hash ring is used to process requests in accordance with an embodiment. A new hash ring 902 is generated according to configuration information 904 specifying a new configuration to be deployed. The hash ring 902 may correspond to the hash ring "Ring N+1" 204 described above with respect to FIG. 2. The configuration information may specify various aspects of the system in addition those described above. Moreover, the configuration information 904 may specify various configuration levels for application of the hash ring and/or nodes thereof. The configuration may specify configuration information 906 for a root level of the hash ring, such that the configuration is applicable to the hash ring and all nodes of the hash-ring. For instance, the configuration 906 specifies that the number of nodes 908 of the hash ring is five. The configuration information 904 may specify constraints related to the hash ring. For instance, the configuration information 904 may specify a direction of the hash ring in which an entity, such as a front-end service or worker manager, should proceed to fulfill service requests. For instance, in normal operation, nodes of a hash ring may be accessed sequentially upward (e.g., sequentially from node 1 to node N), or may be accessed in a counterclockwise direction (i.e., "CCW"). However, the configuration information may specify that nodes of a hash ring should be accessed in the opposite direction—for example, in a counter-clockwise direction, or sequentially counting downward.

The configuration information 906 may include configuration information on a per-node basis, such that one or more of the nodes have configuration information particularly applicable to the node. Configuration information 910A specifies configuration information for the worker manager and/or workers mapped to the first node 908A, configuration information 910B specifies configuration information for the worker manager and/or workers mapped to the second node 908B, and so on. The configuration information 904 may also specify various entities and/or groups to which the hash ring 902 applies. The configuration information 904 may specify that the hash ring 902 applies to specific users (e.g., "User A", "User N") and/or groups or classes of users (e.g., "User Group B"). The configuration information 904 may specify which front-end agents to whom the hash ring 902 should be distributed. Accordingly, a new configuration may be applied to some or all front-end agents; and/or may be selectively applied to specific customers, groups of customers, or all customers at once.

The configuration information may specify attributes other than concurrency limits. The configuration information 904 may specify an attribute for an amount of memory that can be concurrently allocated for fulfillment of service requests, or an attribute for an amount of processing power that can be allocated for fulfillment of service requests. In one embodiment, the configuration may specify attributes related to operating conditions of physical hardware. The configuration 910A for the first node 908A specifies an attribute of a heat limit for workers associated with the node 908A, such that the amount of heat a physical device (e.g., server, rack) associated with the first node 90A is allowed to generate in connection with fulfillment of service requests is 105° F. Some attributes may specify that a server corresponding to a worker operating to fulfill a service request may not continue to fulfill the service request if a threshold temperature is exceeded—for instance, if a temperature associated with the server exceeds 100° F., then the worker manager should transfer information for completing the service request to another worker under its management.

As another example, the constraint may specify that power supplied to a physical computing system (e.g., server or server rack) should be below a certain threshold. For instance, the configuration information 910B for the second node 908B indicates that an amount of power usage that devices associated with the node 908B may use is 150 Watt-hours. Accordingly, if the power draw for the server or server rack exceeds a certain threshold, then the worker manager may transfer or distribute information for completing the service request to other workers under its management. As another example, each node may have an associated priority level that indicates a priority of some nodes relative to others. For instance, the node 908A has a priority level of 1 whereas the second node 908B has a priority level of 3. Accordingly, resources may be attributed to the first node 908A at a higher priority than resources for the second node 908B. The configuration information 910 for the nodes 908 may include information specific to each node, such as network address information indicating the network address of a worker manager associated with the node. Those of ordinary skill in the art will appreciate that these attributes and descriptions are intended to be non-limiting examples of the myriad ways in which the configuration may be applied for a computing resource service provider.

Figure 10:
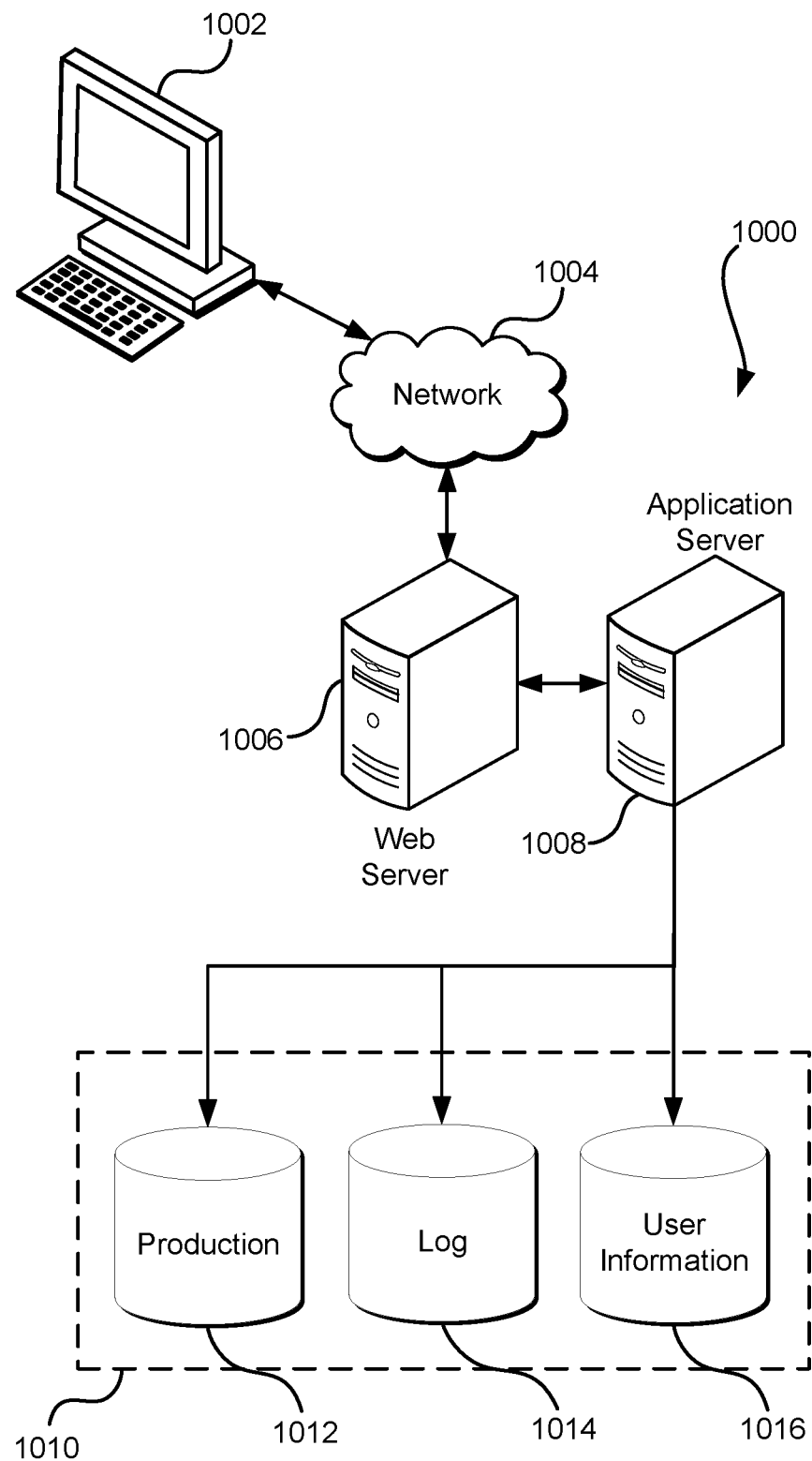
FIG. 10 illustrates an environment in which various embodiments can be implemented.

FIG. 10 illustrates aspects of an example environment 1000 for implementing aspects in accordance with various embodiments. As will be appreciated, although a web-based environment is used for purposes of explanation, different environments may be used, as appropriate, to implement various embodiments. The environment includes an electronic client device 1002, which can include any appropriate device operable to send and/or receive requests, messages, or information over an appropriate network 1004 and, in some embodiments, convey information back to a user of the device. Examples of such client devices include personal computers, cell phones, handheld messaging devices, laptop computers, tablet computers, set-top boxes, personal data assistants, embedded computer systems, electronic book readers, and the like. The network can include any appropriate network, including an intranet, the Internet, a cellular network, a local area network, a satellite network or any other such network and/or combination thereof. Components used for such a system can depend at least in part upon the type of network and/or environment selected. Many protocols and components for communicating via such a network are well known and will not be discussed herein in detail. Communication over the network can be enabled by wired or wireless connections and combinations thereof. In this example, the network includes the Internet and/or other publicly-addressable communications network, as the environment includes a web server 1006 for receiving requests and serving content in response thereto, although for other networks an alternative device serving a similar purpose could be used as would be apparent to one of ordinary skill in the art.

The illustrative environment includes at least one application server 1008 and a data store 1010. It should be understood that there can be several application servers, layers or other elements, processes or components, which may be chained or otherwise configured, which can interact to perform tasks such as obtaining data from an appropriate data store. Servers, as used herein, may be implemented in various ways, such as hardware devices or virtual computer systems. In some contexts, servers may refer to a programming module being executed on a computer system. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered environment. The application server can include any appropriate hardware, software and firmware for integrating with the data store as needed to execute aspects of one or more applications for the client device, handling some or all of the data access and business logic for an application. The application server may provide access control services in cooperation with the data store and is able to generate content including, but not limited to, text, graphics, audio, video and/or other content usable to be provided to the user, which may be served to the user by the web server in the form of HyperText Markup Language ("HTML"), Extensible Markup Language ("XML"), JavaScript, Cascading Style Sheets ("CSS"), JavaScript Object Notation (JSON), and/or another appropriate client-side structured language. Content transferred to a client device may be processed by the client device to provide the content in one or more forms including, but not limited to, forms that are perceptible to the user audibly, visually and/or through other senses. The handling of all requests and responses, as well as the delivery of content between the client device 1002 and the application server 1008, can be handled by the web server using PHP: Hypertext Preprocessor ("PHP"), Python, Ruby, Perl, Java, HTML, XML, JSON, and/or another appropriate server-side structured language in this example. Further, operations described herein as being performed by a single device may, unless otherwise clear from context, be performed collectively by multiple devices, which may form a distributed and/or virtual system.

The data store 1010 can include several separate data tables, databases, data documents, dynamic data storage schemes and/or other data storage mechanisms and media for storing data relating to a particular aspect of the present disclosure. For example, the data store illustrated may include mechanisms for storing production data 1012 and user information 1016, which can be used to serve content for the production side. The data store also is shown to include a mechanism for storing log data 1014, which can be used for reporting, analysis or other such purposes. It should be understood that there can be many other aspects that may need to be stored in the data store, such as page image information and access rights information, which can be stored in any of the above listed mechanisms as appropriate or in additional mechanisms in the data store 1010. The data store 1010 is operable, through logic associated therewith, to receive instructions from the application server 1008 and obtain, update or otherwise process data in response thereto. The application server 1008 may provide static, dynamic, or a combination of static and dynamic data in response to the received instructions. Dynamic data, such as data used in web logs (blogs), shopping applications, news services, and other such applications may be generated by server-side structured languages as described herein or may be provided by a content management system ("CMS") operating on, or under the control of, the application server. In one example, a user, through a device operated by the user, might submit a search request for a certain type of item. In this case, the data store might access the user information to verify the identity of the user and can access the catalog detail information to obtain information about items of that type. The information then can be returned to the user, such as in a results listing on a web page that the user is able to view via a browser on the user device 1002. Information for a particular item of interest can be viewed in a dedicated page or window of the browser. It should be noted, however, that embodiments of the present disclosure are not necessarily limited to the context of web pages, but may be more generally applicable to processing requests in general, where the requests are not necessarily requests for content.

Each server typically will include an operating system that provides executable program instructions for the general administration and operation of that server and typically will include a computer-readable storage medium (e.g., a hard disk, random access memory, read only memory, etc.) storing instructions that, when executed (i.e., as a result of being executed) by a processor of the server, allow the server to perform its intended functions.

The environment, in one embodiment, is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 10. Thus, the depiction of the system 1000 in FIG. 10 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of computers, such as desktop, laptop or tablet computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network. These devices also can include virtual devices such as virtual machines, hypervisors and other virtual devices capable of communicating via a network.

Various embodiments of the present disclosure utilize at least one network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, a satellite network, and any combination thereof. In some embodiments, connection-oriented protocols may be used to communicate between network endpoints. Connection-oriented protocols (sometimes called connection-based protocols) are capable of transmitting data in an ordered stream. Connection-oriented protocols can be reliable or unreliable. For example, the TCP protocol is a reliable connection-oriented protocol. Asynchronous Transfer Mode ("ATM") and Frame Relay are unreliable connection-oriented protocols. Connection-oriented protocols are in contrast to packet-oriented protocols such as UDP that transmit packets without a guaranteed ordering.

In embodiments utilizing a web server, the web server can run any of a variety of server or mid-tier applications, including Hypertext Transfer Protocol ("HTTP") servers, FTP servers, Common Gateway Interface ("CGP") servers, data servers, Java servers, Apache servers, and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Ruby, PHP, Perl, Python or TCL, as well as combinations thereof. The server(s) may also include database servers, including without limitation those commercially available from Oracle®, Microsoft®, Sybase®, and IBM® as well as open-source servers such as MySQL, Postgres, SQLite, MongoDB, and any other server capable of storing, retrieving, and accessing structured or unstructured data. Database servers may include table-based servers, document-based servers, unstructured servers, relational servers, non-relational servers, or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU" or "processor"), at least one input device (e.g., a mouse, keyboard, controller, touch screen, or keypad) and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or web browser. In addition, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). The number of items in a plurality is at least two, but can be more when so indicated either explicitly or by context.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. In some embodiments, the code is stored on set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media may comprise multiple non-transitory computer-readable storage media and one or more of individual non-transitory storage media of the multiple non-transitory computer-readable storage media may lack all of the code while the multiple non-transitory computer-readable storage media collectively store all of the code. Further, in some examples, the executable instructions are executed such that different instructions are executed by different processors. As an illustrative example, a non-transitory computer-readable storage medium may store instructions. A main CPU may execute some of the instructions and a graphics processor unit may execute other of the instructions. Generally, different components of a computer system may have separate processors and different processors may execute different subsets of the instructions.

Accordingly, in some examples, computer systems are configured to implement one or more services that singly or collectively perform operations of processes described herein. Such computer systems may, for instance, be configured with applicable hardware and/or software that enable the performance of the operations. Further, computer systems that implement various embodiments of the present disclosure may, in some examples, be single devices and, in other examples, be distributed computer systems comprising multiple devices that operate differently such that the distributed computer system performs the operations described herein and such that a single device may not perform all operations.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method, comprising:
   generating a hash ring based at least in part on receiving an instruction to deploy a first set of worker managers having a first value for a resource utilization attribute;
   associating the hash ring with one or more previous hash rings associated with a second set of worker managers having a second value for the resource utilization attribute;
   receiving, at a service front-end, a request to perform an operation;
   determining a worker manager of the first set of worker managers associated with the request based at least in part on the hash ring, the worker manager managing a set of workers to perform one or more tasks indicated in the request;
   determining information associated with a set of predecessor worker managers of the second set of worker managers based at least in part on at least one previous hash ring of the one or more previous hash rings, the information for the set of predecessor worker managers being determined based at least in part on the first value and the second value;
   providing the request and the information associated with the set of predecessor worker managers to the worker manager to enable processing of the request;
   transmitting a set of requests for state information to the set of predecessor worker managers; and
   causing performance of the operation by a worker corresponding to the state information.

2. The computer-implemented method of claim 1, wherein the resource utilization attribute corresponds to a constraint on a number of requests that can be concurrently maintained for the first set of worker managers.

3. The computer-implemented method of claim 1, wherein determining the information associated with the set of predecessor worker managers maps an association between the set of predecessor worker managers and nodes of the one or more previous hash rings.

4. The computer-implemented method of claim 1, wherein a node count of the hash ring is different than a node count of the one or more previous hash rings.

5. A system, comprising:
   one or more processors; and
   memory that stores computer-executable instructions that, as a result of execution by the one or more processors, cause the system to:
   receive a first configuration specifying an attribute to be incorporated in deployment of a new hash ring;
   generate the new hash ring according to the first configuration;
   associate a worker manager with the new hash ring;
   identify a set of predecessor worker managers having a second configuration associated with the attribute that is different than the first configuration, the set of predecessor worker managers being associated with a predecessor hash ring; and
   obtain, in fulfillment of a request to perform an operation at a service endpoint of the system, state information associated with the set of predecessor worker managers according to the first configuration for the attribute, wherein obtaining the state information associated with the set of predecessor worker managers causes a transfer of control of a computing resource from the set of predecessor worker managers to the worker manager.

6. The system of claim 5, wherein a node count of the new hash ring is different than a node count of the predecessor hash ring.

7. The system of claim 5, wherein the worker manager is associated with a first node at a first position of the new hash ring, and wherein at least one of the set of predecessor worker managers is associated with a second node that is at a second position on the predecessor hash ring that is different than the first position of the new hash ring.

8. The system of claim 5, wherein the state information is obtained based at least in part on processing the first configuration and the second configuration using an algorithm.

9. The system of claim 5, wherein the first configuration causes the worker manager to control a different collection of computing resources than a collection of computing resources controlled by one of the set of predecessor worker managers.

10. The system of claim 5, wherein the instructions further cause the one or more processors to:
    deploy a second worker manager having the first configuration; and
    associate the second worker manager at a second node on the new hash ring that is different than a first node associated with the worker manager.

11. The system of claim 5, wherein the state information is determined to be insufficient to fulfill the request based at least in part on the first configuration, and the system obtains additional state information for fulfillment of the request from the set of predecessor worker managers.

12. A non-transitory computer-readable storage medium having stored thereon executable instructions that, as a result of being executed by one or more processors of a computer system, cause the computer system to at least:
    deploy a new configuration for a first set of worker managers according to configuration information for attributes of the first set of worker managers, each worker manager of the first set of work managers managing a set of workers to process service requests;
    associate a new hash ring with the first set of worker managers;
    identify predecessor information of a set of predecessor worker managers based at least in part on a previous hash ring;
    allocate, using the predecessor information, first state information associated with a first predecessor worker manager and second state information associated with a second predecessor worker manager to a new worker manager for processing a service request received; and transfer control of a computing resource from the set of predecessor worker managers to the first set of worker managers.

13. The non-transitory computer-readable storage medium of claim 12, wherein the configuration information specifies a constraint on resource utilization.

14. The non-transitory computer-readable storage medium of claim 12, wherein the first state information and the second state information is obtained based on the configuration information.

15. The non-transitory computer-readable storage medium of claim 12, wherein the configuration information causes the new hash ring to have a different attribute than the previous hash ring.

16. The non-transitory computer-readable storage medium of claim 12, wherein the configuration information specifies an attribute for the new hash ring.

17. The non-transitory computer-readable storage medium of claim 12, wherein the configuration information specifies a constraint for the first set of worker managers.

18. The non-transitory computer-readable storage medium of claim 12, wherein configuration information specifies a constraint for operating conditions of physical hardware associated with service endpoints.

* * * * *